US010115793B2

(12) United States Patent
Nagata

(10) Patent No.: US 10,115,793 B2
(45) Date of Patent: Oct. 30, 2018

(54) SEMICONDUCTOR DEVICE

(71) Applicant: Renesas Electronics Corporation, Koutou-ku, Tokyo (JP)

(72) Inventor: Nao Nagata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/706,554

(22) Filed: Sep. 15, 2017

(65) Prior Publication Data

US 2018/0145134 A1 May 24, 2018

(30) Foreign Application Priority Data

Nov. 24, 2016 (JP) .................................. 2016-227933

(51) Int. Cl.
*H01L 29/74* (2006.01)
*H01L 31/111* (2006.01)
(Continued)

(52) U.S. Cl.
CPC ...... *H01L 29/0696* (2013.01); *H01L 29/0619* (2013.01); *H01L 29/083* (2013.01);
(Continued)

(58) Field of Classification Search
CPC ............. H01L 29/7397; H01L 29/1095; H01L 29/0696; H01L 29/4236; H01L 29/66333
(Continued)

(56) References Cited

U.S. PATENT DOCUMENTS 7,633,122 B2 * 12/2009 Otsuki ................ H01L 29/7397
257/330
9,099,522 B2    8/2015 Onozawa
(Continued)

FOREIGN PATENT DOCUMENTS

| DE | 10 2013 010 734 A1 | 1/2014 |
|----|--------------------|--------|
| EP | 2 613 356 A2       | 7/2013 |
| WO | WO 2011/111500 A1  | 9/2011 |

OTHER PUBLICATIONS

Extended European Search Report for European Patent Application No. 17191763.6, dated Mar. 8, 2018.

*Primary Examiner* — Theresa T Doan
(74) *Attorney, Agent, or Firm* — Shapiro, Gabor and Rosenberger, PLLC

(57) ABSTRACT

An improvement is achieved in the IE effect of a semiconductor device including an IGBT having an active cell region with an EGE structure. Each of a plurality of hybrid cell regions extending in a Y-axis direction has first, second, and third trench electrodes extending in the Y-axis direction, a p-type body region, and contact trenches provided between the first and second trench electrodes and between the first and third trench electrodes to extend in the Y-axis direction and reach middle points in the p-type body region. Each of the hybrid cell regions further has a plurality of $n^+$-type emitter regions formed in an upper surface of a semiconductor substrate located between the contact trenches and the first trench electrode to be shallower than the contact trenches and spaced apart at regular intervals in the Y-direction in plan view. The $n^+$-type emitter regions are arranged in a staggered configuration in plan view.

18 Claims, 30 Drawing Sheets

(51) Int. Cl.
*H01L 29/06* (2006.01)
*H01L 29/10* (2006.01)
*H01L 29/423* (2006.01)
*H01L 29/66* (2006.01)
*H01L 29/739* (2006.01)
*H01L 29/40* (2006.01)
*H01L 29/08* (2006.01)

(52) U.S. Cl.
CPC ........ *H01L 29/1095* (2013.01); *H01L 29/407* (2013.01); *H01L 29/4236* (2013.01); *H01L 29/6634* (2013.01); *H01L 29/66333* (2013.01); *H01L 29/66348* (2013.01); *H01L 29/7396* (2013.01); *H01L 29/7397* (2013.01); *H01L 29/4238* (2013.01)

(58) Field of Classification Search
USPC .......................................................... 257/139
See application file for complete search history.

(56) References Cited

U.S. PATENT DOCUMENTS

| | | |
|---|---|---|
| 2005/0156231 A1 | 7/2005 | Okuno et al. |
| 2007/0040215 A1* | 2/2007 | Ma .................. H01L 29/0696 257/330 |
| 2014/0070270 A1 | 3/2014 | Yoshida et al. |

* cited by examiner

SEMICONDUCTOR DEVICE

CROSS-REFERENCE TO RELATED APPLICATIONS

The disclosure of Japanese Patent Application No. 2016-227933 filed on Nov. 24, 2016 including the specification, drawings and abstract is incorporated herein by reference in its entirety.

BACKGROUND

The present invention relates to a semiconductor device and can be used appropriately for a semiconductor device including, e.g., an IE (Injection Enhancement) type trench gate IGBT (Insulated Gate Bipolar Transistor).

As an IGBT having a low collector-emitter saturation voltage VCE (sat), a trench gate IGBT is used widely. An IE type trench gate IGBT has been developed in which, in a cell formation area, active cell regions coupled to an emitter electrode and inactive cell regions each including a floating region are alternately arranged to allow an IE effect to be used. The IE effect reduces the likelihood of discharge of holes from the emitter electrode when the IGBT is in an ON state to thus increase the density of charges stored in a drift region.

International Patent Publication No. WO2011/111500 (Patent Document 1) discloses a technique in which, in an insulated-gate semiconductor device, between adjacent first trenches, one or more second trenches provided in parallel with the first trenches are formed and, in each of the second trenches, a first conductor is embedded via an insulating film.

RELATED ART DOCUMENT

Patent Document

[Patent Document 1]
International Patent Publication No. WO2011/111500

SUMMARY

There is a semiconductor device including, as an IE type trench gate IGBT, an IGBT having an active cell region with an EGE structure (emitter-gate-emitter structure).

In the semiconductor device including the IGBT having the active cell region with the EGE structure, to improve a load short-circuit resistance, a floating region is provided in an inactive cell region. However, when the floating region is increased in area, the resistance of the base of a parasitic pnp bipolar transistor when viewed from the collector thereof increases. This causes the problems of a reduced base current supply (electron supply) and the degraded IE effect.

Other problems and novel features of the present invention will become apparent from a statement in the present specification and the accompanying drawings.

A semiconductor device in an embodiment includes a plurality of hybrid cell regions provided in a first main surface of a cell formation area of a semiconductor substrate to be spaced apart from each other in a first direction and extend in a second direction orthogonal to the first direction and a plurality of inactive cell regions provided between the plurality of hybrid cell regions. Each of the plurality of hybrid cell regions has first and second trenches extending in the second direction and a third trench formed between the first and second trenches. Each of the plurality of hybrid cell regions further has a body region having a first conductivity type and formed in the first main surface of the semiconductor substrate located between the first and third trenches and between the second and third trenches, a first coupling portion provided between the first and third trenches to reach a middle point in the body region, and a second coupling portion provided between the second and third trenches to reach a middle point in the body region. Each of the plurality of hybrid cell regions further has a plurality of emitter regions each having a second conductivity type, formed in the first main surface of the semiconductor substrate located between the first coupling portion and the third trench portion and between the second coupling portion and the third trench portion to be shallower than the first and second coupling portions, and spaced apart at a given interval in the second direction. In the cell formation area, the plurality of emitter regions are arranged in a staggered configuration in plan view.

According to the embodiment, it is possible to improve the IE effect of the semiconductor device including the IGBT having the active cell region with the EGE structure.

DETAILED DESCRIPTION

Figure 1:
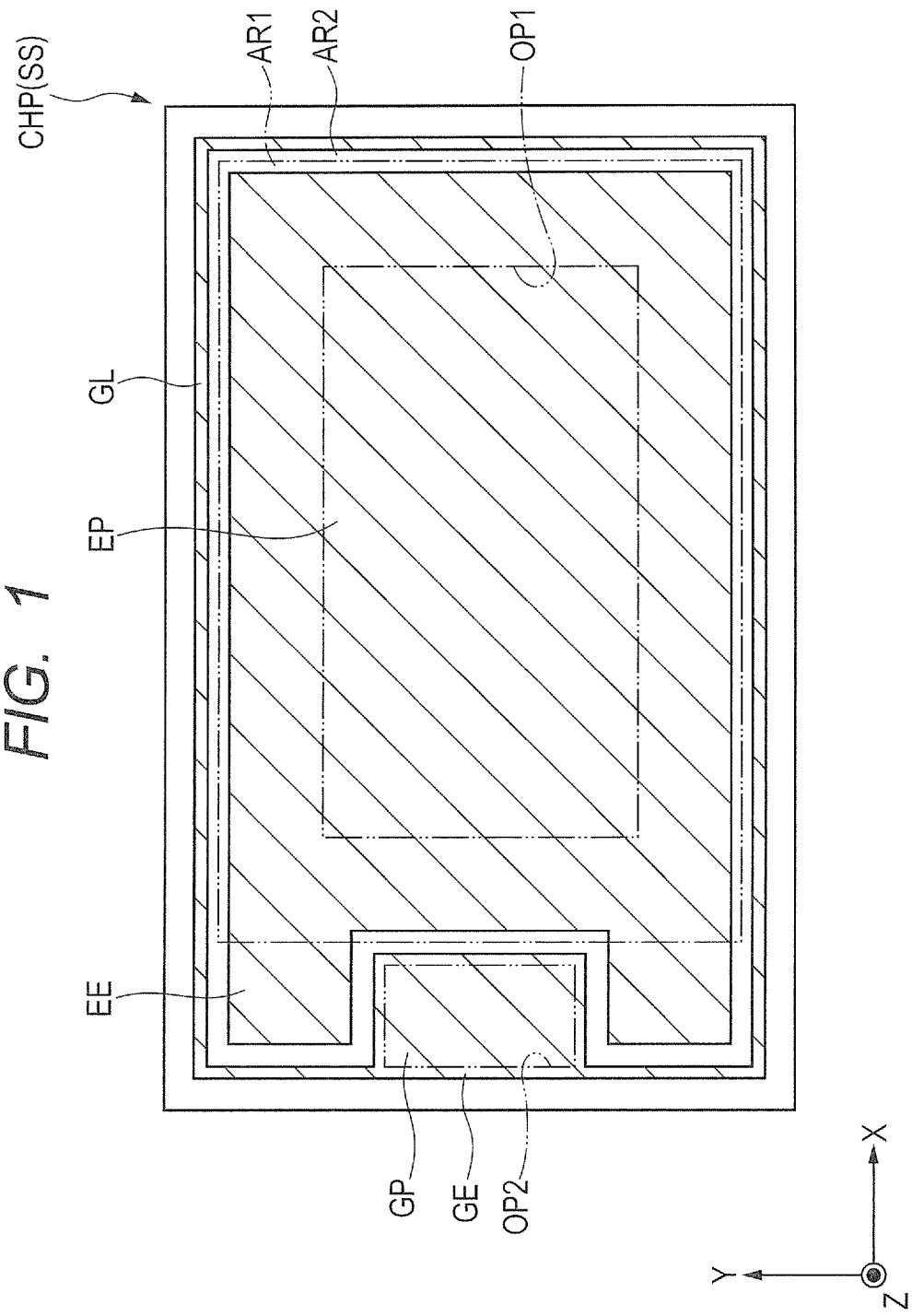
FIG. 1 is a plan view showing a semiconductor device (semiconductor chip) according to Embodiment 1.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is modifications, application examples, detailed explanation, supplementary explanation, and so forth of part or the whole of the others. Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers.

Also, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes and the like are assumed to include those substantially proximate or similar thereto and the like unless particularly explicitly described otherwise or unless it can be considered that they obviously do not in principle. The same shall apply in regard to the foregoing number and the like (including the number, numerical value, amount, range, and the like).

The following will describe the embodiments in detail on the basis of the drawings. Note that, throughout all the drawings for illustrating the embodiments, members having the same functions are designated by the same or related reference numerals, and the repeated description thereof is omitted. When there are a plurality of similar members (portions), marks may be added to general reference numerals to show individual or specific portions. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

In a cross-sectional view and a plan view, the sizes of individual portions do not correspond to those in a real device. For improved clarity of illustration, a specific portion may be shown in a relatively large size. Even when a cross-sectional view and a plan view correspond to each other, for improved clarity of illustration, a specific portion may be shown in a relatively large size.

Referring to the drawings, the following will describe a semiconductor device according to each of the embodiments of the present invention in detail. The semiconductor device according to the embodiment is an IE type trench gate IGBT. The semiconductor device according to the embodiment is referred to as the IE type because of the IE effect achieved thereby. The IE effect limits the discharge of holes (positive holes) into an emitter electrode (toward an upper surface or a top surface) when an IGBT is in an ON state to allow an increase in the density of charges stored in a drift region. The semiconductor device according to the embodiment is also referred to as an EGE structure (emitter-gate-emitter structure) because, among three trench electrodes spaced apart at regular intervals, the one trench electrode (TG1) disposed at the middle is electrically coupled to a gate electrode, while the two trench electrodes (TG2 and TG3) disposed on both ends are each electrically coupled to the emitter electrode.

Figure 31:
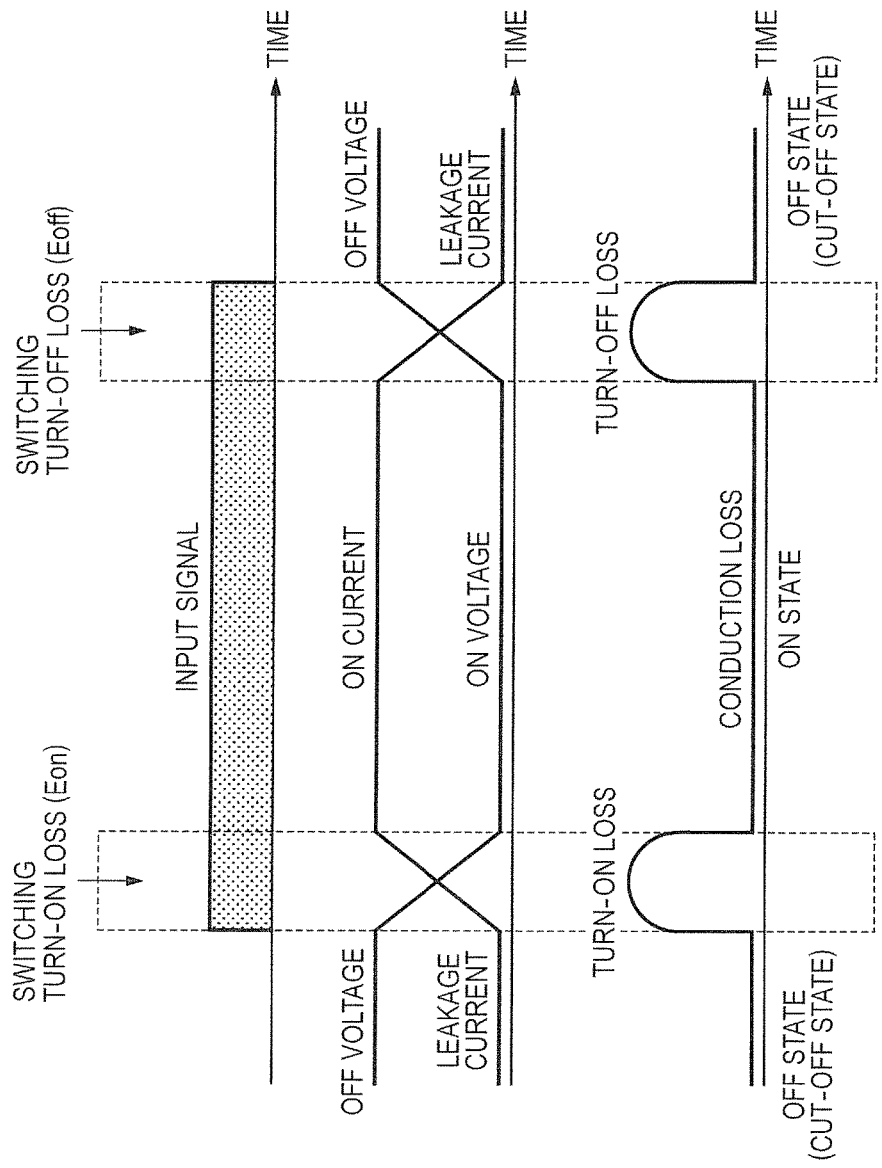
FIG. 31 is a schematic diagram showing the operating state of an IGBT.

Note that, in the following description, as shown in FIG. 31, a switching operation in which the IGBT shifts from an OFF state (cut-off state) into the ON state is referred to as "turn-ON", while a switching operation in which the IGBT shifts from the ON state into the OFF state (cut-off state) is referred to as "turn-OFF". In addition, a loss at a turn-ON time is referred to as a "turn-ON loss", a loss in the ON state is referred to as a "conduction loss", and a loss at a turn-OFF time is referred to as a "turn-OFF loss".

Embodiment 1

<Configuration of Semiconductor Device in Embodiment 1>

Using FIG. 1, a description will be given of a configuration of a semiconductor device according to Embodiment 1.

FIG. 1 is a plan view showing a semiconductor device (semiconductor chip) according to Embodiment 1. Note that, for easier understanding, FIG. 1 shows the semiconductor device in a see-through state where an insulating film FPF (see FIG. 4) has been removed and shows the respective outer peripheries of a cell formation area AR1, an emitter pad EP, and a gate pad GP by the two-dot-dash lines.

As shown in FIG. 1, a semiconductor chip CHP as the semiconductor device according to Embodiment 1 has a semiconductor substrate SS. The semiconductor substrate SS has an upper surface Sa (see FIG. 4) as one main surface and a lower surface Sb (see FIG. 4) as the other main surface opposite to the upper surface. The semiconductor substrate SS also has the cell formation area AR1 as a local area of the upper surface Sa and a gate line lead-out area AR2 as another local area of the upper surface Sa. The gate line lead-out area AR2 is provided, e.g., closer to the outer periphery of the semiconductor substrate SS than the cell formation area AR1.

In the cell formation area AR1, an emitter electrode EE is provided. The center portion of the emitter electrode EE serves as the emitter pad EP to which a bonding wire or the like is to be coupled. The emitter pad EP is made of the portion of the emitter electrode EE which is exposed from an opening OP1 formed in the insulating film FPF (see FIG. 4) formed so as to cover the emitter electrode EE. The emitter electrode EE is made of a metal film containing, e.g., aluminum as a main component.

In the gate line lead-out area AR2, a gate line GL and a gate electrode GE are provided. For example, the gate line GL is provided closer to the outer periphery of the semiconductor substrate SS than the emitter electrode EE. The gate line GL is coupled to the gate electrode GE. The center portion of the gate electrode GE serves as the gate pad GP to which a bonding wire or the like is to be coupled. The gate pad GP is made of the portion of the gate electrode GE which is exposed from an opening OP2 formed in the insulating film FPF (see FIG. 4) formed so as to cover the gate electrode GE. Each of the gate line GL and the gate electrode GE is made of a metal film containing, e.g., aluminum as a main component.

<Configuration of Cell Formation Area in Semiconductor Device in Embodiment 1>

Using FIGS. 2 to 4, a description will be given of a configuration of the cell formation area in the semiconductor device according to Embodiment 1.

Figure 2:
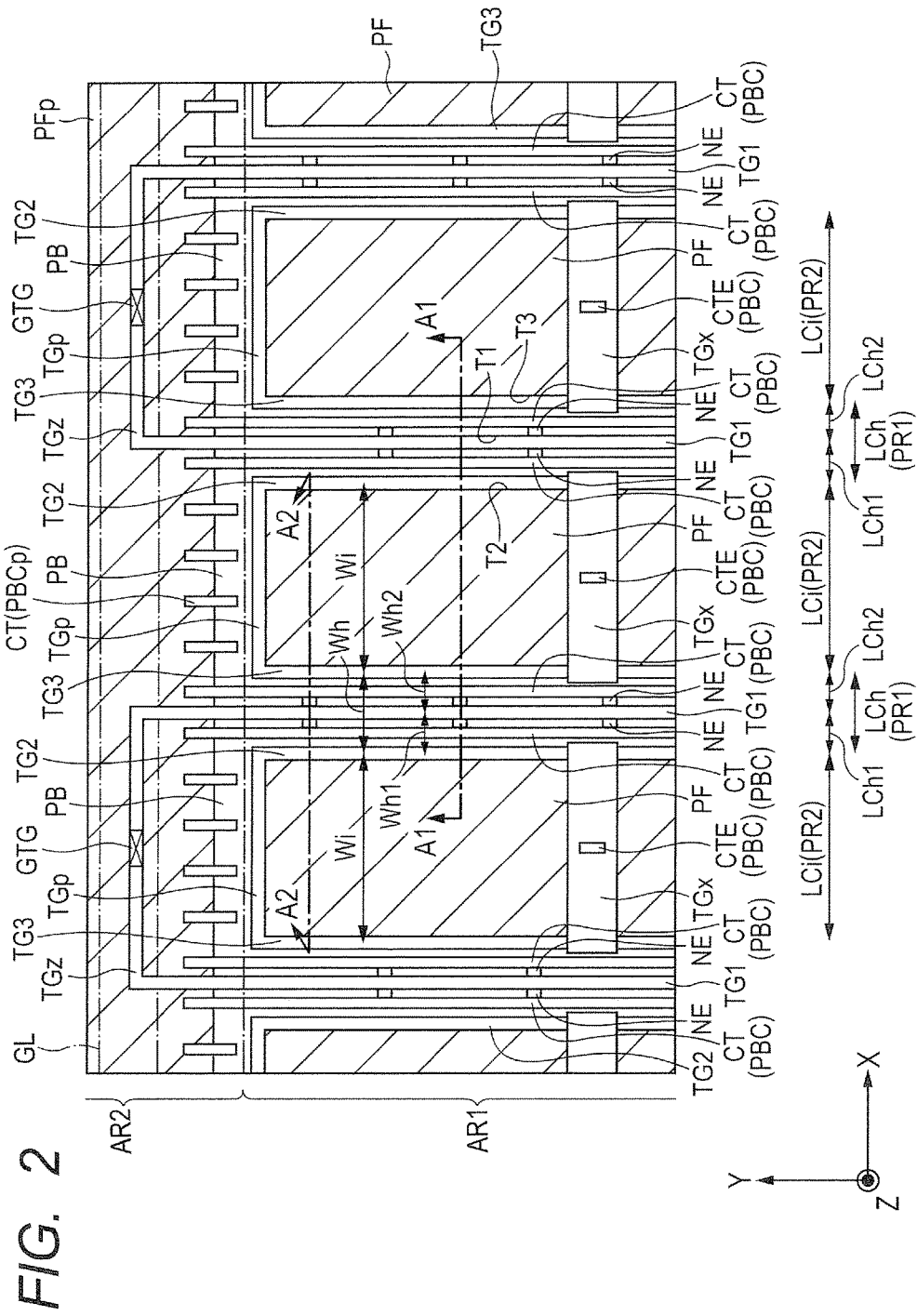
FIG. 2 is a plan view showing the semiconductor device (cell formation area and gate line lead-out area) according to Embodiment 1.

FIG. 2 is a plan view showing the semiconductor device (cell formation area and gate line lead-out area) according to Embodiment 1. FIG. 3 is a plan view showing the semiconductor device (cell formation area) according to Embodiment 1. FIG. 4 is a cross-sectional view along the line A1-A1 in FIG. 2. Note that, for easier understanding, FIG. 2 shows the semiconductor device in a see-through state where the insulating film FPF, the emitter electrode EE, and an interlayer insulating film IL (see FIG. 4) have been removed, while showing the respective outer peripheries of the cell formation area AR1 and the gate line GL by the two-dot-dash lines. On the other hand, in FIG. 3, for improved clarity of illustration, $n^+$-type emitter regions are blacked out.

Figure 3:
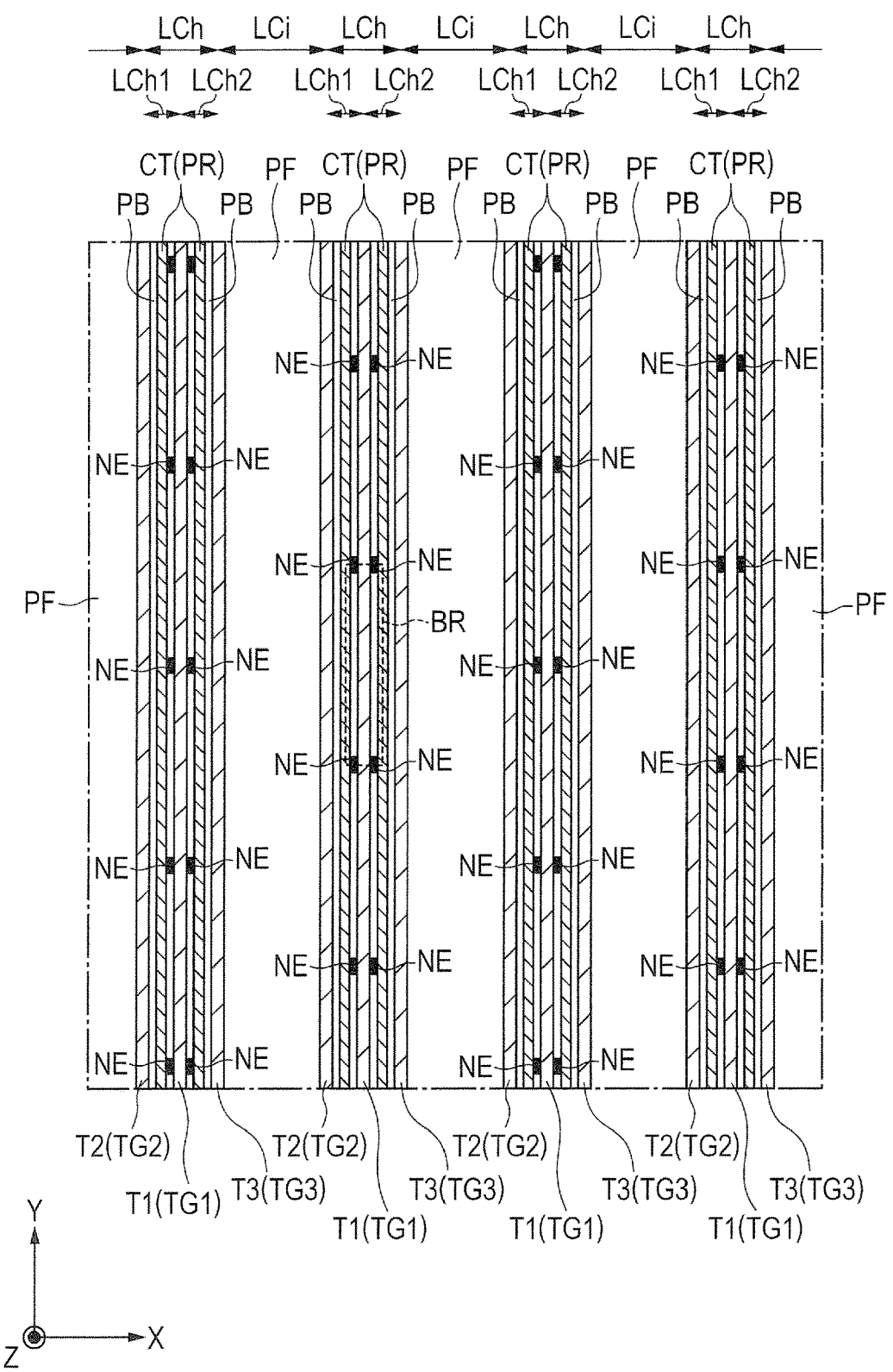
FIG. 3 is a plan view showing the semiconductor device (cell formation area) according to Embodiment 1.
Figure 4:
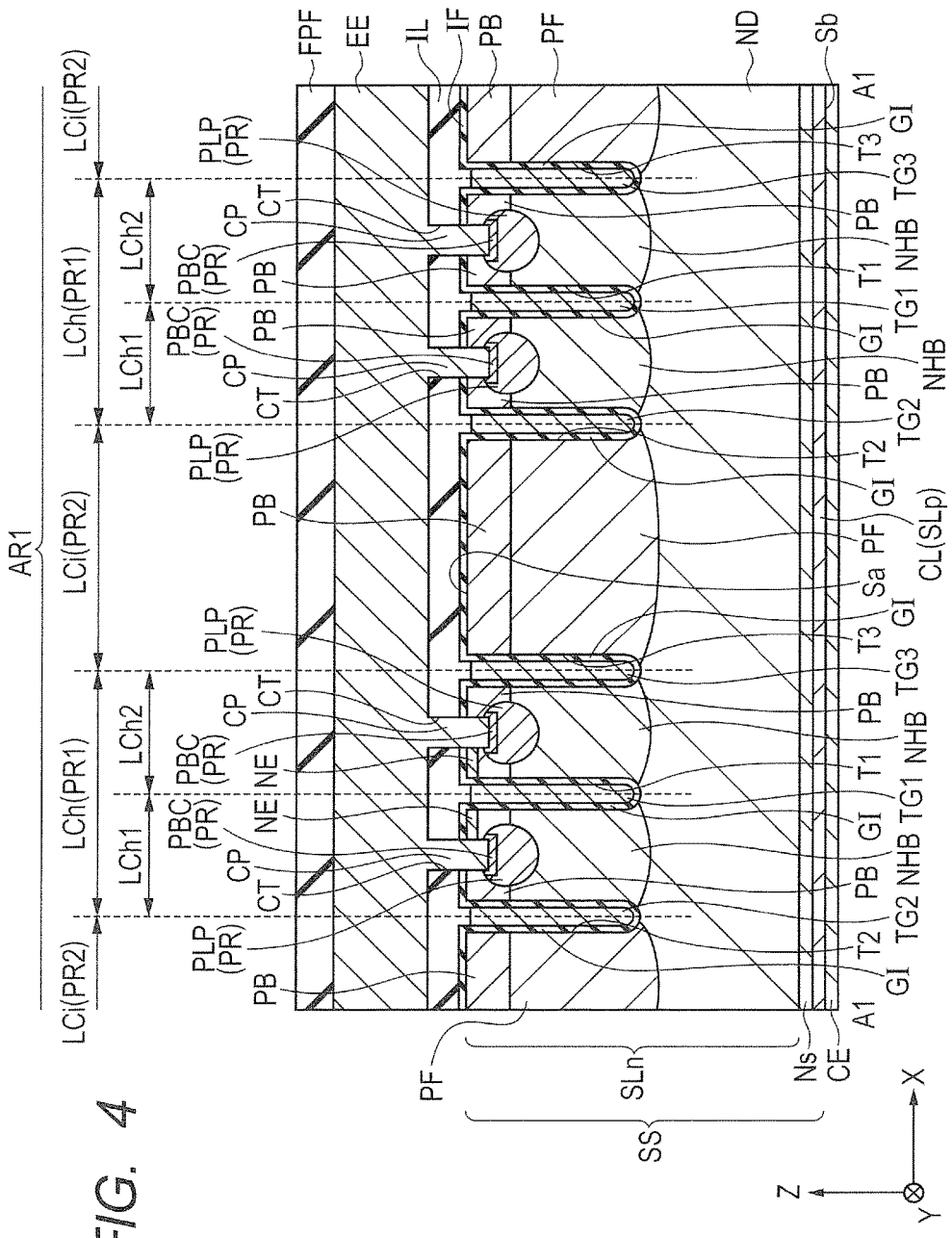
FIG. 4 is a cross-sectional view along the line A1-A1 in FIG. 2.

As shown in FIGS. 2 to 4, two directions crossing or preferably orthogonally crossing each other in the upper surface Sa of the semiconductor substrate SS are assumed to be an X-axis direction and a Y-axis direction, while a direction perpendicular to the upper surface Sa of the semiconductor substrate SS, i.e., a vertical direction is assumed to be a Z-axis direction. At this time, in the cell formation area AR1, as shown in FIG. 2, a plurality of hybrid cell regions LCh as active cell regions and a plurality of inactive cell regions LCi are provided. In plan view, the plurality of hybrid cell regions LCh extend in the Y-axis direction and are periodically arranged in the X-axis direction. In plan view, the plurality of inactive cell regions LCi extend in the Y-axis direction and are periodically arranged in the X-axis direction. The hybrid cell regions LCh and the inactive cell regions LCi are alternately arranged in the X-axis direction.

Note that, in the present specification, the wording "in plan view" shows the case where the semiconductor device is viewed in the direction perpendicular to the upper surface Sa of the semiconductor substrate SS.

In each of the hybrid cell regions LCh, an element portion PR1 as an IGBT transistor is formed. In each of the inactive cell regions LCi, an interposed portion PR2 interposed between the adjacent two element portions PR1 is formed.

Next, using FIGS. 2 and 3, a description will be given of a two-dimensional structure of the semiconductor device according Embodiment 1.

As shown in FIGS. 2 and 3, each of the hybrid cell regions LCh has a hybrid sub-cell region LCh1 and a hybrid sub-cell region LCh2. In the hybrid cell region LCh, in a boundary surface between the hybrid sub-cell regions LCh1 and LCh2, a trench electrode TG1 as a trench gate electrode is provided.

The trench electrode TG1 is provided at the middle of each of the hybrid cell region LCh. This allows a width Wh1 of the hybrid sub-cell region LCh1 to be equal to a width Wh2 of the hybrid sub-cell region LCh2 and allows the hybrid sub-cell regions LCh1 and LCh2 to be symmetrically arranged relative to the trench electrode TG1 located at the middle therebetween.

In each of the hybrid cell regions LCh, trench electrodes TG2 and TG3 are provided. The trench electrodes TG2 and TG3 are provided on both sides of the trench electrode TG1 interposed therebetween in the X-axis direction. The trench electrodes TG2 and TG3 are electrically coupled to the emitter electrode EE. In the hybrid cell region LCh, between the trench electrodes TG2 and TG3 adjacent to each other, p-type body regions PB are provided. In addition, n-type hole barrier regions NHB are provided deeper than the p-type body regions PB (see FIG. 4).

In the hybrid sub-cell region LCh1, a plurality of $n^+$-type emitter regions NE are provided in the portions of the p-type body region PB which are closer to the upper surface Sa of the semiconductor substrate SS. The p-type body region PB is a semiconductor region having a p-type conductivity type, while the $n^+$-type emitter regions NE are semiconductor regions each having an n-type conductivity type different from the p-type conductivity type. In the hybrid sub-cell region LCh1, the p-type body region PB is formed continuously along the Y-axis direction in plan view. In the hybrid sub-cell region LCh1, the plurality of $n^+$-type emitter regions NE are spaced apart at regular intervals along the Y-axis direction.

In the present specification, the p-type conductivity type of a semiconductor means that the density of holes is higher than the density of electrons and the holes are major charge carriers, though only the holes or both the electrons and the holes may be charge carriers. Also, in the present specification, the n-type conductivity type of a semiconductor means that the density of electrons is higher than the density of holes and the electrons are major charge carriers, though only the electrons or both the electrons and the holes may be charge carriers.

In the hybrid sub-cell region LCh2, the plurality of $n^+$-type emitter regions NE are provided in the portions of the p-type body region PB which are closer to the upper surface Sa of the semiconductor substrate SS. In the hybrid sub-cell region LCh2, the p-type body region PB is formed continuously along the Y-axis direction in plan view. In the hybrid sub-cell region LCh2, the plurality of $n^+$-type emitter regions NE are spaced apart at regular intervals along the Y-axis direction.

In each of the hybrid cell regions LCh, the plurality of $n^+$-type emitter regions NE formed in the hybrid sub-cell region LCh1 are disposed symmetrically to the plurality of $n^+$-type emitter regions NE formed in the hybrid sub-cell region LCh2 relative to the trench electrode TG1 interposed therebetween.

Also, in each of the hybrid cell regions LCh, the plurality of $n^+$-type emitter regions NE are spaced apart at regular intervals in the Y-axis direction in plan view. However, the respective plurality of $n^+$-type emitter regions NE formed in the two hybrid cell regions LCh adjacent to each other in the X-axis direction are not arranged symmetrically to each other relative to the inactive cell region LCi located between the two hybrid cell regions LCh, but are arranged to be staggered or offset from each other by a distance corresponding to half the interval between adjacent two of the $n^+$-type emitter regions NE in the Y-axis direction.

Specifically, with regard to the two hybrid cell regions LCh adjacent to each other in the X-axis direction, one of the plurality of $n^+$-type emitter regions NE formed in one of the adjacent two hybrid-cell regions LCh is disposed in the X-direction from the region interposed between two of the plurality of $n^+$-type emitter regions NE formed in the other of the adjacent two hybrid cell regions LCh which are adjacent to each other in the Y-axis direction. The region interposed between the two $n^+$-type emitter regions NE adjacent to each other in the Y-axis direction is, e.g., a region BR enclosed by the dotted line shown in FIG. 3. In other words, in the cell formation area AR1, the plurality of $n^+$-type emitter regions NE are arranged in a so-called staggered configuration in plan view. In still other words, in the cell formation area AR1, a basic pattern in which the $n^+$-type emitter regions NE are located at the individual vertices of a triangle is consecutively arranged in plan view.

In Embodiment 1, the respective plurality of $n^+$-type emitter regions NE formed in the two hybrid cell regions LCh adjacent to each other in the X-axis direction are arranged to be staggered or offset from each other by a distance corresponding to half the interval between adjacent two of the $n^+$-type emitter regions NE in the Y-axis direction, but the arrangement of the $n^+$-type emitter regions NE is not limited thereto. However, to supply sufficient electrons to substantially the entire cell formation area AR1, the respective plurality of $n^+$-type emitter regions NE formed in the two hybrid cell regions LCh adjacent to each other in the X-axis direction are preferably arranged to be staggered or offset from each other by a distance corresponding to half the interval between adjacent two of the $n^+$-type emitter regions NE in the Y-axis direction.

By thus arranging the plurality of $n^+$-type emitter regions NE in the staggered configuration in plan view, it is possible to improve the IE effect, as will be described later in <Main Advantages and Effects of Semiconductor Device in Embodiment 1>. This can reduce a switching loss at a turn-ON time and reduce a collector-emitter saturation voltage VCE (sat).

In each of the inactive cell regions LCi, between the trench electrodes TG2 and TG3 adjacent to each other, the p-type body region PB is provided. Also, a p-type floating region PF is provided deeper than the p-type body region PB.

In the example shown in FIG. 2, the width Wh of each of the hybrid cell regions LCh in the X-axis direction is set smaller than a width Wi of each of the inactive cell regions LCi in the X-axis direction. At such a time, the IE effect of the IGBT can be enhanced.

The gate line lead-out area AR2 has a portion in which, e.g., a p-type floating region PFp is provided so as to surround the cell formation area AR1. The p-type floating region PFp is electrically coupled to the emitter electrode EE via the portions of a $p^+$-type body contact region PBCp which are exposed at the bottom surfaces of contact trenches CT.

In the gate line lead-out area AR2, the gate line GL is placed, and the trench electrodes TG1 extend from within the cell formation area AR1 toward the gate line GL. In the gate line lead-out area AR2, the respective end portions of the adjacent two trench electrodes TG1 are coupled to each other by trench electrodes TGz. In plan view, the trench electrodes TGz are disposed in the area where the gate line GL is placed. The trench electrodes TGz are electrically coupled to the gate line GL via coupling electrodes GTG. Note that the end portions of the inactive cell regions LCi which are closer to the gate line lead-out area AR2 are defined by end-portion trench electrodes TGp.

The trench electrodes TG2 and TG3 are disposed on both sides of the inactive cell region LCi located between the adjacent two hybrid cell regions LCh in plan view. The trench electrodes TG2 and TG3 are electrically coupled to each other not only by the end-portion trench electrodes TGp, but also by emitter coupling portions TGx each made of, e.g., a polysilicon film. The emitter coupling portions TGx are electrically coupled to the emitter electrode EE via coupling electrodes CTE. By providing such a structure, it is possible to improve the reliability of the electrical coupling between each of the trench electrodes TG2 and TG3 and the emitter electrode EE.

In each of the hybrid sub-cell regions LCh1, a $p^+$-type semiconductor region PR including a $p^+$-type body contact region PBC and a $p^+$-type latch-up prevention region PLP is formed (see FIG. 4). The $p^+$-type semiconductor region PB is formed continuously along the Y-axis direction. Also, in the hybrid sub-cell region LCh1, the contact trench CT as an opening is formed continuously along the Y-axis direction in the p-type body region PB. The contact trench CT reaches the $p^+$-type body contact region PBC located in the hybrid sub-cell region LCh1.

Also, in each of the hybrid sub-cell regions LCh2, the $p^+$-type semiconductor region PR including the $p^+$-type body contact region PBC and the $p^+$-type latch-up prevention region PLP is formed (see FIG. 4). The $p^+$-type semiconductor region PB is formed continuously along the Y-axis direction. Also, in the hybrid sub-cell region LCh2, the contact trench CT as the opening is formed continuously along the Y-axis direction in the p-type body region PB. The contact trench CT reaches the $p^+$-type body contact region PBC located in the hybrid sub-cell region LCh2.

Next, using FIG. 4, a description will be given of a cross-sectional structure of the semiconductor device according to Embodiment 1. Specifically, a description will be given of a configuration of the element portions PR1 provided in the hybrid cell regions LCh and the interposed portions PR2 provided in the inactive cell regions LCi.

As shown in FIG. 4, the semiconductor substrate SS has the upper surface Sa as the first main surface and the lower surface Sb as the second main surface opposite to the upper surface Sa. In the semiconductor substrate SS, an n-type semiconductor layer SLn is formed. In the portion of the semiconductor substrate SS which is located closer to the lower surface Sb than the semiconductor layer SLn, a p-type semiconductor layer SLp is formed.

In the portion of the semiconductor layer SLn which is other than the upper-layer portion thereof, an $n^-$-type drift region ND as an n-type semiconductor region is formed. Between the semiconductor layers SLn and SLp, an n-type field stop region Ns as an n-type semiconductor region is formed. The semiconductor layer SLp forms a $p^+$-type collector region CL as a p-type semiconductor region. Under the lower surface Sb of the semiconductor substrate Sb, a collector electrode CE electrically coupled to the $p^+$-type collector region CL, i.e., the semiconductor layer SLp is formed. On the other hand, in the upper surface Sa of the semiconductor substrate SS, i.e., in the upper-layer portion of the semiconductor layer SLn, the p-type body regions PB are provided.

In the hybrid cell regions LCh of the upper surface Sa of the semiconductor substrate SS, the element portions PR1 are formed in the semiconductor layer SLn while, in the inactive cell regions LCi of the upper surface Sa of the semiconductor substrate SS, the interposed portions PR2 are formed.

The element portion PR1 formed in each of the hybrid cell regions LCh has trenches T1, T2, and T3, the trench electrodes TG1, TG2, and TG3, the two p-type body regions PB, and the plurality of $n^+$-type emitter regions NE.

As described above, each of the hybrid cell regions LCh has the hybrid sub-cell regions LCh1 and LCh2.

In the upper surface Sa of the semiconductor substrate SS located at the boundary portion between the hybrid sub-cell regions LCh1 and LCh2, the trench T1 as a trench portion is formed. The trench T1 extends from the upper surface Sa in the Y-axis direction in plan view to reach a middle point in the semiconductor layer SLn.

Over the inner wall of the trench T1, a gate insulating film GI is formed. In the trench T1, over the gate insulating film GI, the trench electrode TG1 is formed so as to be embedded in the trench T1. That is, the trench electrode TG1 is embedded in the trench T1 via the gate insulating film GI. The trench electrode TG1 is electrically coupled to the gate electrode E (see FIG. 1). Note that, in plan view, the trench electrode TG1 is formed continuously along the Y-axis direction.

In the hybrid sub-cell region LCh1, in the upper surface Sa of the semiconductor substrate SS, the trench T2 as the trench portion is formed. The trench T2 extends from the upper surface Sa in the Y-axis direction in plan view to reach a middle point in the semiconductor layer SLn and is disposed closer to one of the inactive cell regions LCi located in the X-axis direction than the trench T1.

Over the inner wall of the trench T2, the gate insulating film GI is formed. In the trench T2, over the gate insulating film GI, the trench electrode TG2 is formed so as to be embedded in the trench T2. That is, the trench electrode TG2 is embedded in the trench T2 via the gate insulating film GI.

The trench electrode TG2 is electrically coupled to the emitter electrode EE. Note that, in plan view, the trench electrode TG2 is formed continuously along the Y-axis direction.

In the hybrid sub-cell region LCh2, in the upper surface Sa of the semiconductor substrate SS, the trench T3 as the trench portion is formed. The trench T3 extends from the upper surface Sa in the Y-axis direction in plan view to reach a middle point in the semiconductor layer SLn and is disposed closer to the other of the inactive cell regions LCi located in the X-axis direction than the trench T1.

Over the inner wall of the trench T3, the gate insulating film GI is formed. In the trench T3, over the gate insulating film GI, the trench electrode TG3 is formed so as to be embedded in the trench T3. That is, the trench electrode TG3 is embedded in the trench T3 via the gate insulating film GI. The trench electrode TG3 is electrically coupled to the emitter electrode EE. Note that, in plan view, the trench electrode TG3 is formed continuously along the Y-axis direction.

In each of the hybrid sub-cell regions LCh1, the p-type body region PB is formed in the portion of the semiconductor layer SLn which is located between the trenches T1 and T2 and closer to the upper surface Sa to come in contact with each of the gate insulating film GI formed over the inner wall of the trench T1 and the gate insulating film GI formed over the inner wall of the trench T2. On the other hand, in each of the hybrid sub-cell regions LCh2, the p-type body region PB is formed in the portion of the semiconductor layer SLn which is located between the trenches T1 and T3 and closer to the upper surface Sa to come in contact with each of the gate insulating film GI formed over the inner wall of the trench T1 and the gate insulating film GI formed over the trench T3.

As shown in FIG. 4, in each of the hybrid sub-cell regions LCh1 and LCh2, in the upper surface Sa of the semiconductor substrate SS, the plurality of $n^+$-type emitter regions NE are formed only in the vicinity of the trench electrode TG1.

As described above, in the hybrid sub-cell region Ch1, the plurality of $n^+$-type emitter regions NE are spaced apart at regular intervals along the Y-axis direction in plan view. In the hybrid sub-cell region LCh2, the plurality of $n^+$-type emitter regions NE are spaced apart at regular intervals along the Y-axis direction in plan view.

In the hybrid sub-cell region LCh1, the plurality of $n^-$-type emitter regions NE are formed in the portion of the semiconductor layer SLn which is located between the trenches T1 and T2 and closer to the upper surface Sa to come in contact with each of the p-type body region PB and the gate insulating film GI formed over the inner wall of the trench T1. On the other hand, in the hybrid sub-cell region LCh2, the plurality of $n^+$-type emitter regions NE are formed in the portion of the semiconductor layer SLn which is located between the trenches T1 and T3 and closer to the upper surface Sa to come in contact with each of the p-type body region PB and the gate insulating film GI formed over the inner wall of the trench T1.

The plurality of $n^+$-type emitter regions NE formed in the hybrid sub-cell region LCh1 are electrically coupled to the emitter electrode EE. The plurality of $n^+$-type emitter regions NE formed in the hybrid sub-cell region LCh2 are electrically coupled to the emitter electrode EE.

Preferably, in the hybrid sub-cell region LCh1, in the portion of the semiconductor layer SLn which is located between the trenches T1 and T2 and closer to the lower surface Sb than the p-type body region PB, the n-type hole barrier region NHB as an n-type semiconductor region is formed. Also, in the hybrid sub-cell region LCh2, in the portion of the semiconductor layer SLn which is located between the trenches T1 and T3 and closer to the lower surface Sb than the p-type body region PB, the n-type hole barrier region NHB as the n-type semiconductor region is formed.

In the hybrid sub-cell region LCh1, the n-type impurity concentration in the n-type hole barrier region NHB is higher than the n-type impurity concentration in the portion (n$^-$-type drift region ND) of the semiconductor layer SLn which is located closer to the lower surface Sb than the n-type hole barrier region NHB. Also, in the hybrid sub-cell region LCh2, the n-type impurity concentration in the n-type hole barrier region NHB is higher than the n-type impurity concentration in the portion (n$^-$-type drift region ND) of the semiconductor layer SLn which is located closer to the lower surface Sb than the n-type hole barrier region NHB.

On the other hand, in the hybrid sub-cell region LCh1, the n-type impurity concentration in the n-type hole barrier region NHB is lower than the n-type impurity concentration in the n$^-$-type emitter region NE. Also, in the hybrid sub-cell region LCh2, the n-type impurity concentration in the n-type hole barrier region NHB is lower than the n-type impurity concentration in the n$^+$-type emitter region NE.

Note that, in the hybrid sub-cell region LCh1, the n-type hole barrier region NHB may also be in contact with each of the p-type body region PB, the gate insulating film GI formed over the inner wall of the trench T1, and the gate insulating film GI formed over the inner wall of the trench T2. Also, in the hybrid sub-cell region LCh2, the n-type hole barrier region NHB may also be in contact with each of the p-type body region PB, the gate insulating film GI formed over the inner wall of the trench T1, and the gate insulating film GI formed over the inner wall of the trench T3. In that case, the holes stored in the n$^-$-type drift region ND are less likely to be discharged into the emitter electrode EE from each of the hybrid sub-cell regions LCh1 and LCh2 to allow the IE effect to be enhanced.

The interposed portion PR2 formed in each of the inactive cell regions LCi and interposed between the adjacent two element portions PR1 has the p-type body region PB and the p-type floating region PF.

In each of the inactive cell regions LCi, in the portion of the semiconductor layer SLn which is located between the trenches T2 and T3 adjacent to each other and closer to the upper surface Sa, the p-type body region PB is formed. The p-type body region PB is in contact with each of the gate insulating film GI formed over the inner wall of the trench T2 and the gate insulating film GI formed over the inner wall of the trench T3 adjacent to the trench T2.

In each of the inactive cell regions LCi, in the portion of the semiconductor layer SLn which is located between the trenches T2 and T3 adjacent to each other and located under the p-type body region PB, the p-type floating region PF as the p-type semiconductor region is formed.

A description will be given herein of the purpose of providing the p-type floating region PF.

The saturation voltage of the voltage VCE as the collector-emitter voltage in a forward direction is referred to as the collector-emitter saturation voltage VCE (sat). At this time, to reduce the collector-emitter saturation voltage VCE (sat), it is necessary to improve the IE effect. On the other hand, when a load is short-circuited in, e.g., an inverter due to malfunction or the like, a high voltage is applied to the IGBT or a large short-circuit current flows in the IGBT, and the IGBT is required not to break down until a protection circuit breaks down. When a load is brought into a short-circuited state and a short-circuit current flows in the IGBT, a time period during which the IGBT can withstand the short-circuit current without breaking down is referred to herein as a load short-circuit resistance.

To improve the load short-circuit resistance, it is necessary to reduce the energy applied to the IGBT, i.e., reduce a saturation current flowing in the IGBT. To reduce the saturation current, it is necessary to reduce the area of the n$^+$-type emitter regions NE and, to reduce the area of the n$^+$-type emitter regions NE, the use of two methods can be considered.

The first method removes some of the n$^+$-type emitter regions NE in the Y-axis direction. However, this method increases the collector-emitter saturation voltage VCE (sat).

The second method provides the p-type floating region PF in each of the inactive cell regions LCi to remove some of the n$^+$-type emitter regions NE in the X-axis direction. This narrows the discharge path of holes as carriers and improves the IE effect. That is, the p-type floating region PF is provided so as to remove some of the n$^+$-type emitter regions NE in the X-axis direction and thus improve the load short-circuit resistance.

As shown in FIG. 4, in the hybrid cell regions LCh and the inactive cell regions LCi, the interlayer insulating film IL made of, e.g., silicon dioxide or the like is formed over the upper surface Sa of the semiconductor substrate SS. The interlayer insulating film IL is formed so as to cover the p-type body regions PB in the hybrid cell regions LCh and the inactive cell regions LCi. Note that, between the upper surface Sa of the semiconductor substrate SS and the interlayer insulating film IL, an insulating film IF may also be formed.

In Embodiment 1, in each of the hybrid sub-cell regions LCh1 and LCh2, the contact trench CT as the opening extending through the interlayer insulating film IL and reaching a middle point in the p-type body region PB is formed. In each of the hybrid sub-cell regions LCh1 and LCh2, the contact trench CT is formed continuously along the Y-axis direction in plan view.

In each of the hybrid sub-cell regions LCh1 and LCh2, in the portion of the p-type body region PB which is exposed at the bottom surface of the contact trench CT, the p$^+$-type body contact region PBC as the p-type semiconductor region is formed. Under the p$^+$-type body contact region PBC, the p$^+$-type latch-up prevention region PLP as the p-type semiconductor region is formed. The p$^+$-type body contact region PBC and the p$^+$-type latch-up prevention region PLP form the p$^+$-type semiconductor region PR.

That is, in each of the hybrid sub-cell regions LCh1 and LCh2, the p$^+$-type semiconductor region PR includes the p$^+$-type body contact region PBC and the p$^+$-type latch-up prevention region PLP. In each of the hybrid sub-cell regions LCh1 and LCh2, the p-type impurity concentration in the p$^+$-type body contact region PBC is higher than the p-type impurity concentration in the p$^+$-type latch-up prevention region PLP. Also, in each of the hybrid sub-cell regions LCh1 and LCh2, the p-type impurity concentration in the p$^+$-type latch-up prevention region PLP is higher than the p-type impurity concentration in the p$^+$-type body region PB. That is, in each of the hybrid sub-cell regions LCh1 and LCh2, the p-type impurity concentration in the p$^+$-type semiconductor region PR is higher than the p-type impurity concentration in the p-type body region PB.

In each of the hybrid sub-cell regions LCh1 and LCh2, the p$^+$-type semiconductor region PR is formed in the portion of the p-type body region PB which is exposed in the contact trench CT. In the hybrid sub-cell region LCh1, the p$^+$-type semiconductor region PR is formed in the portion of the semiconductor layer SLn which is located between the trenches T1 and T2. On the other hand, in the hybrid sub-cell region LCh2, the p$^+$-type semiconductor region PR is formed in the portion of the semiconductor layer SLn which is located between the trenches T1 and T3.

In the hybrid sub-cell region LCh1, a coupling electrode CP embedded in the contact trench CT is formed. Also, in the hybrid sub-cell region LCh2, the coupling electrode CP embedded in the contact trench CT is formed. That is, each of the element portions PR1 has the interlayer insulating film IL, the two contact trenches CT, the two p$^+$-type semiconductor regions PR, and the two coupling electrodes CP.

In each of the hybrid sub-cell regions LCh1 and LCh2, the coupling electrode CP is in contact with the n$^+$-type emitter regions NE and the p$^+$-type semiconductor region PR. Accordingly, in each of the hybrid sub-cell regions LCh1 and LCh2, the n$^-$-type emitter regions NE and the p$^+$-type semiconductor region PR are electrically coupled to the emitter electrode EE via the coupling electrode CP. That is, the p-type body regions PB included in each of the element portions PR1 are electrically coupled to the emitter electrode EE.

In each of the hybrid sub-cell regions LCh1 and LCh2, in a pair of the coupling electrode CP and the p$^+$-type semiconductor region PR which are coupled to each other, the coupling electrode CP is in contact with the p$^+$-type body contact region PBC included in the p$^+$-type semiconductor region PR. This can reduce the contact resistance between the coupling electrode CP and the p$^+$-type semiconductor region PR.

As shown in FIG. 4, over the interlayer insulating film IL1, the emitter electrode EE made of a metal film containing, e.g., aluminum as a main component is provided. The emitter electrode EE is coupled to the n$^+$-type emitter regions NE and to the p$^+$-type body contact regions PBC via the coupling electrodes CP formed in the contact trenches CT. In the example shown in FIG. 4, the coupling electrodes CP and the n$^+$-type emitter regions NE are integrally formed.

Over the emitter electrode EE, the insulating film FPF as a passivation film made of, e.g., a polyimide-based organic insulating film or the like is formed.

In each of the hybrid cell regions LCh, the collector electrode CE, the p$^+$-type collector region CL, the n$^-$-type drift region ND, the p-type body regions PB, the p$^+$-type semiconductor regions PR, the n$^+$-type emitter regions NE, the emitter electrode EE, the gate insulating film GI formed over the inner wall of the trench T1, and the trench electrode TG1 form the IGBT.

<Method of Manufacturing Semiconductor Device>

Next, using FIGS. 5 to 10, a description will be given of a method of manufacturing the semiconductor device according to Embodiment 1.

FIGS. 5 to 10 are cross-sectional views showing the manufacturing process of the semiconductor device according to Embodiment 1. FIGS. 5 to 10 are cross-sectional views along the line A2-A2 in FIG. 2.

Figure 5:
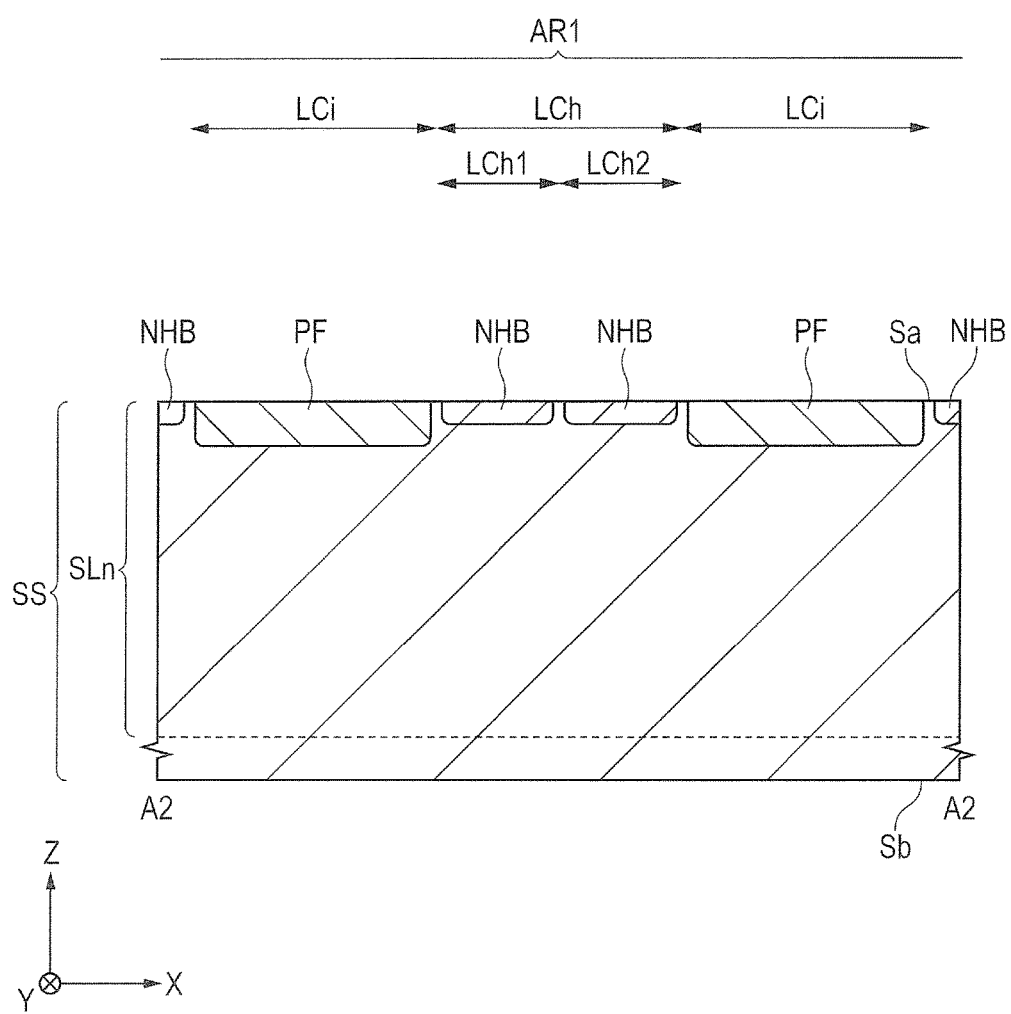
FIG. 5 is a cross-sectional view (cross-sectional view along the line A2-A2 in FIG. 2) showing the manufacturing process of the semiconductor device according to Embodiment 1.

First, as shown in FIG. 5, the semiconductor substrate SS made of a silicon single crystal in which an n-type impurity such as, e.g., phosphorus is introduced is prepared. The semiconductor substrate SS has the upper surface Sa as the first main surface and the lower surface Sb as the second main surface opposite to the upper surface Sa.

The n-type impurity concentration in the semiconductor substrate SS can be controlled to, e.g., about $2\times10^{14}$ cm$^{-3}$. At this stage, the semiconductor substrate SS is a thin plate referred to as a wafer made of a semiconductor and having a generally circular two-dimensional shape. The thickness of the semiconductor substrate SS can be controlled to, e.g., about 450 μm to 1,000 μm. Note that the semiconductor layer in the semiconductor substrate SS which is closer to the upper surface Sa is assumed to be the semiconductor layer SLn. The semiconductor layer SLn is the n-type semiconductor layer. It follows that, when the semiconductor substrate SS is prepared, the n-type semiconductor layer SLn is formed in the semiconductor substrate SS.

Next, by an ion implantation method using a resist pattern as a mask, an n-type impurity is introduced into the upper surface Sa of the semiconductor substrate SS to form the n-type hole barrier regions NHB. Preferred examples of ion implantation conditions used at this time include, e.g., an ion species of phosphorus, a dose of about $6\times10^{12}$ cm$^{-2}$, and an implantation energy of about 80 keV.

Note that the n-type hole barrier regions NHB are formed in the hybrid sub-cell regions LCh1 and LCh2 included in each of the adjacent two hybrid cell regions LCh.

Next, by an ion implantation method using a resist pattern as a mask, a p-type impurity is introduced into the upper surface Sa of the semiconductor substrate SS to form the p-type floating region PF. Preferred examples of ion implantation conditions used at this time include, e.g., an ion species of boron, a dose of about $3.5\times10^{13}$ cm$^{-2}$, and an implantation energy of about 75 keV.

Note that the p-type floating region PF is formed in each of the inactive cell regions LCi. When the p-type floating regions PF are formed in the cell formation area AR1, the p-type floating region PFp is formed in, e.g., the gate line lead-out area AR2 (see FIG. 2).

Figure 6:
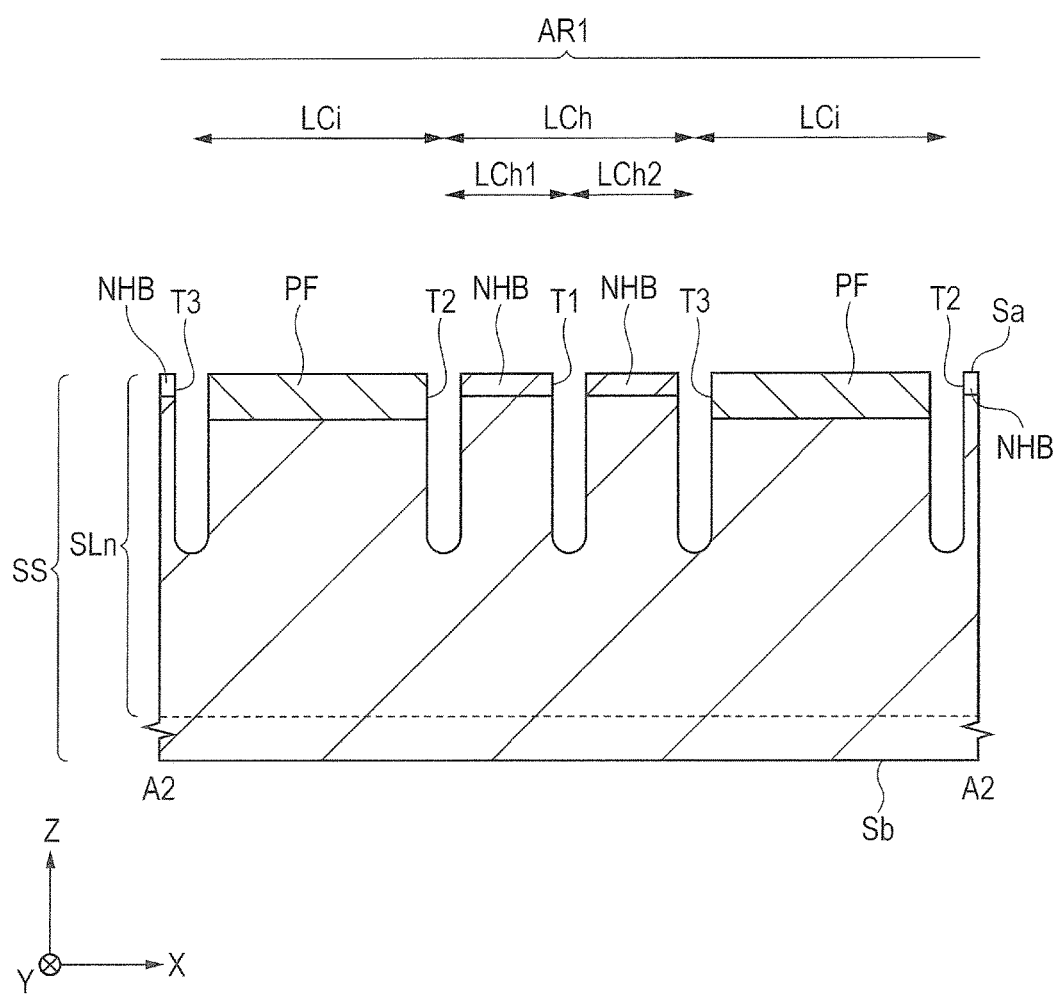
FIG. 6 is a cross-sectional view of the semiconductor device during the manufacturing process thereof, which is subsequent to FIG. 5.

Next, as shown in FIG. 6, using a hard mask made of, e.g., a silicon dioxide film, the trenches T1, T2, and T3 are formed by, e.g., an anisotropic dry etching method. Preferred examples of a gas for the anisotropic dry etching include a Cl$_2$/O$_2$-based gas.

Figure 7:
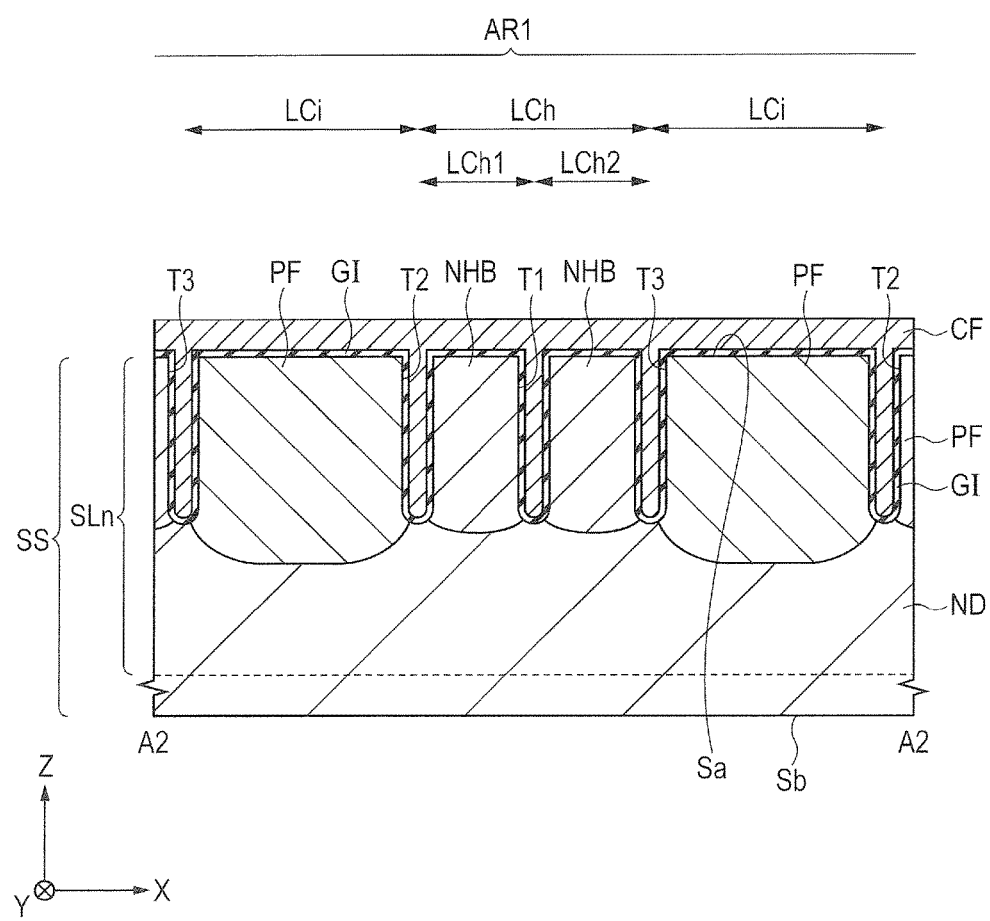
FIG. 7 is a cross-sectional view of the semiconductor device during the manufacturing process thereof, which is subsequent to FIG. 6.

Next, as shown in FIG. 7, extension diffusion (e.g., at 1200° C. for about 30 minutes) with respect to the p-type floating regions PF and the n-type hole barrier regions NHB is performed. At this time, the extension diffusion is performed such that the end portions of the p-type floating regions PF which are closer to the lower surface Sb are located at the respective end portions of the trenches T1, T2, and T3 which are closer to the lower surface Sb in the Z-axis direction.

Next, by, e.g., a thermal oxidation method or the like, the gate insulating film GI made of, e.g., a silicon dioxide film is formed over each of the upper surface Sa of the semiconductor substrate SS and the respective inner walls of the trenches T1, T2, and T3. The thickness of the gate insulating film GI is, e.g., about 0.12 μm.

By the foregoing extension diffusion, the p-type floating regions PF are formed between the trenches T2 and the trenches T3 adjacent thereto. Preferably, the p-type floating regions PF are in contact with the gate insulating film GI formed over the respective inner walls of the trenches T2 and T3.

In addition, the n-type hole barrier regions NHB are formed between the trenches T1 and the trenches T2 adjacent thereto and between the trenches T1 and the trenches T3 adjacent thereto. It is preferable that the n-type hole barrier regions NHB formed between the trenches T1 and T2 are in contact with the gate insulating film GI formed over the respective inner walls of the trenches T1 and T2. It is also preferable that the n-type hole barrier regions NHB formed between the trenches T1 and T3 are in contact with the gate insulating film GI formed over the respective inner walls of the trenches T1 and T3.

In the n-type semiconductor substrate SS, the region where the p-type floating regions PF and the n-type hole barrier regions NHB are not formed during the foregoing extension diffusion serves as the n$^-$-type drift region ND. In other words, in the n-type semiconductor layer SLn, the region where the p-type floating regions PF and the n-type hole barrier regions NHB are not formed serves as the n$^-$-type drift region ND. Note that the n$^-$-type drift region ND is formed to extend from within the semiconductor layer SLn to the lower surface Sb of the semiconductor substrate SS.

Between the trenches T1 and T2, the n-type impurity concentration in the n-type hole barrier region NHB is higher than the n-type impurity concentration in the n$^-$-type drift region ND and lower than the n-type impurity concentration in the n$^+$-type emitter region NE described later. The same holds true not only between the trenches T1 and T2, but also between the trenches T1 and T3.

Next, over the upper surface Sa of the semiconductor substrate SS and in the trenches T1, T2, and T3, a conductive film CF made of a polysilicon film doped with phosphorus (Doped Poly-Silicon Film) is deposited by, e.g., a CVD (Chemical Vapor Deposition) method or the like. The thickness of the conductive film CF is, e.g., about 0.5 µm to 1.5 µm.

Figure 8:
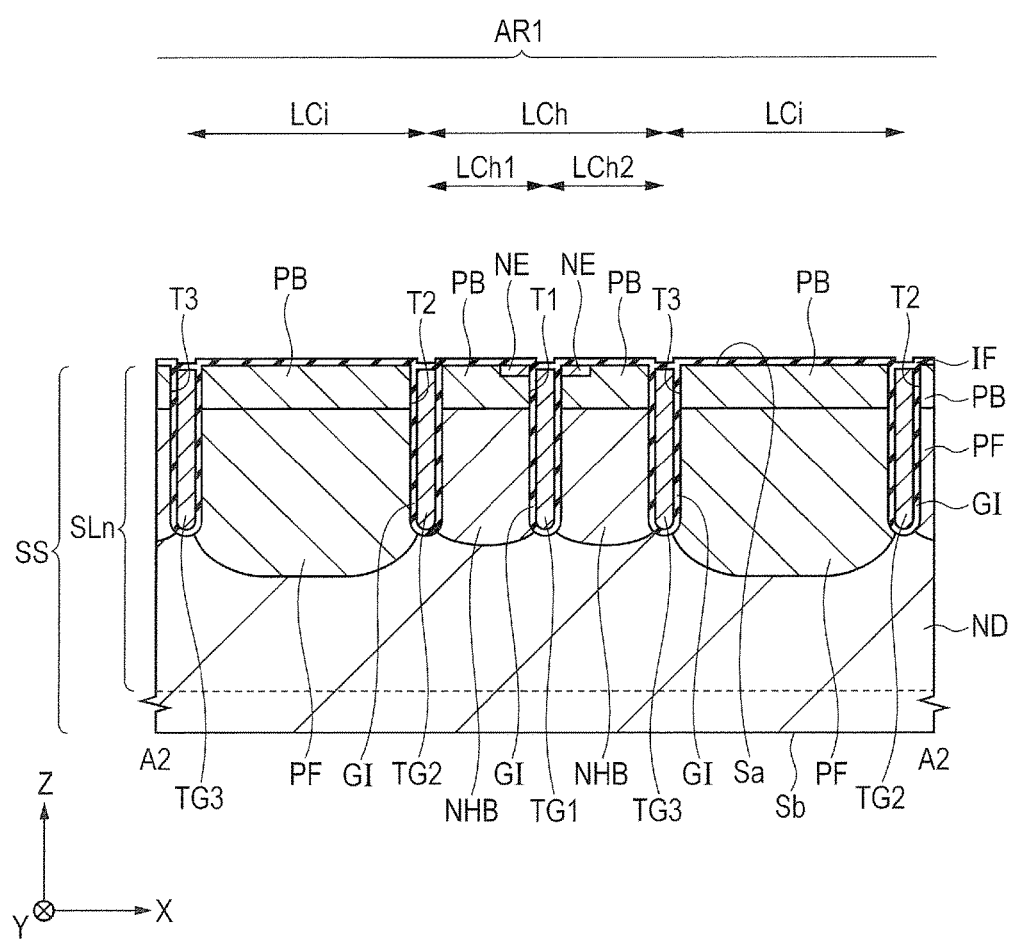
FIG. 8 is a cross-sectional view of the semiconductor device during the manufacturing process thereof, which is subsequent to FIG. 7.

Next, as shown in FIG. 8, the conductive film CF is etched back by, e.g., a dry etching method. Thus, the trench electrode TG1 made of the conductive film CF embedded in the trench T1 via the gate insulating film GI is formed. Also, the trench electrode TG2 made of the conductive film CF embedded in the trench T2 via the gate insulating film GI is formed, and the trench electrode TG3 made of the conductive film CF embedded in the trench T3 via the gate insulating film GI is formed. Preferred examples of a gas for the etching include a SF$_6$ gas.

Next, by, e.g., a dry etching method, the gate insulating film GI except for that in the trenches T1, T2, and T3 is removed.

Next, by, e.g., a thermal oxidation method or a CVD method, over the upper surface Sa of the semiconductor substrate SS, the insulating film IF made of a relatively thin silicon dioxide film (about as thin as, e.g., the gate insulating film GI) for subsequent ion implantation is formed.

Next, by an ion implantation method using a resist pattern as a mask, a p-type impurity is introduced into the entire cell formation area AR1 and into other portions which need the introduction thereof to form the p-type body regions PB.

Specifically, between the trenches T1 and T2, the p-type body region PB is formed to come in contact with the gate insulating film GI formed over the respective inner walls of the trenches T1 and T2. Also, between the trenches T1 and T3, the p-type body region PB is formed to come in contact with the gate insulating film GI formed over the respective inner walls of the trenches T1 and T3. The p-type body regions PB are formed over the n-type hole barrier regions NHB. Also, in the inactive cell regions LCi, the p-type body regions PB are formed over the p-type floating regions PF.

Preferred examples of ion implantation conditions used at this time include, e.g., an ion species of boron, a dose of about 3×10$^{13}$ cm$^{-2}$, and an implantation energy of about 75 keV.

By an ion implantation method using a resist pattern as a mask, in the hybrid cell regions LCh, an n-type impurity is further introduced into the upper-layer portions of the p-type body regions PB to form the n$^+$-type emitter regions NE.

The n$^+$-type emitter regions NE are formed only in the vicinities of the trench electrodes TG1 in the hybrid sub-cell regions LCh1 and LCh2. Specifically, in the hybrid sub-cell region LCh1, in the portion of the semiconductor layer SLn which is located between the trenches T1 and T2, each of the n$^+$-type emitter regions NE is formed to come in contact with each of the gate insulating film GI formed over the inner wall of the trench T1 and the p-type body region PB. Also, in the hybrid sub-cell region LCh2, in the portion of the semiconductor layer SLn which is located between the trenches T1 and T3, each of the n$^+$-type emitter regions NE is formed to come in contact with each of the gate insulating film GI formed over the inner wall of the trench T1 and the p-type body region PB.

Preferred examples of ion implantation conditions used at this time include, e.g., an ion species of arsenic, a dose of about 5×10$^{15}$ cm$^{-2}$, and an implantation energy of about 80 keV.

Figure 9:
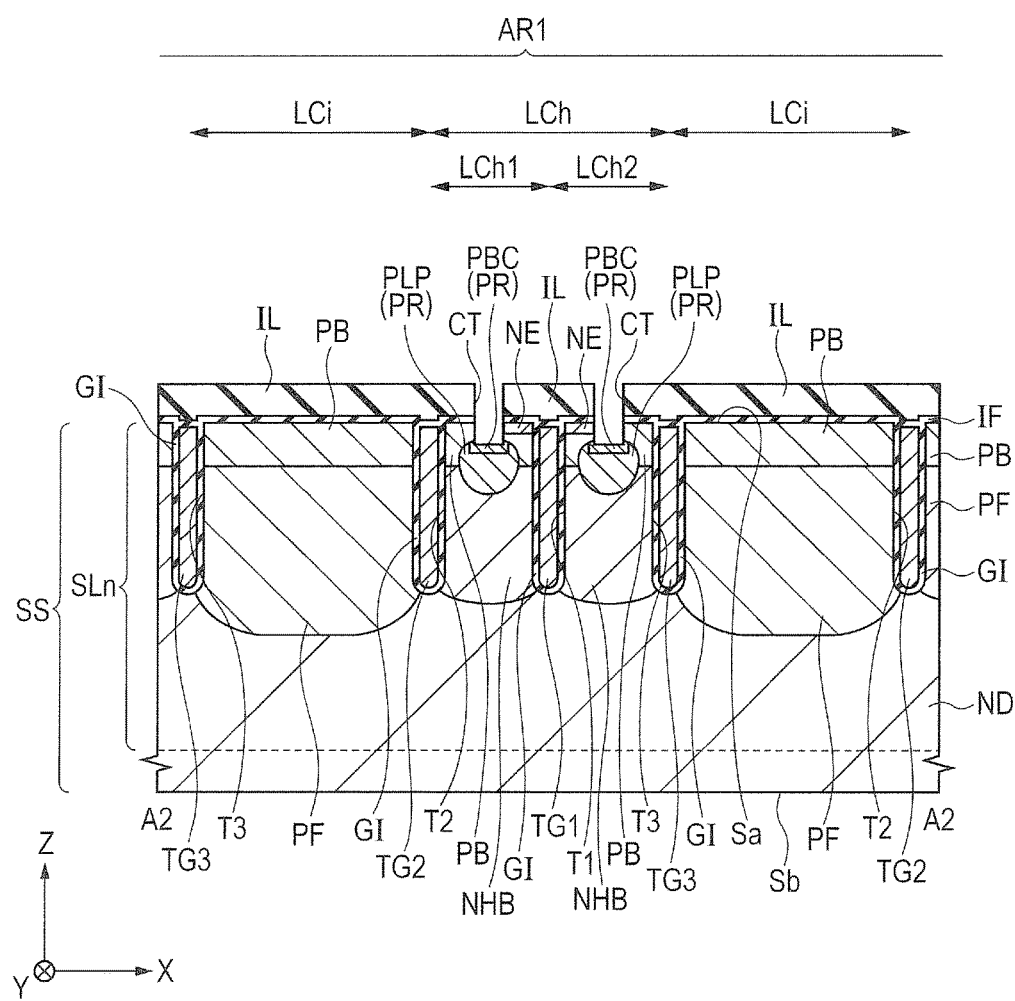
FIG. 9 is a cross-sectional view of the semiconductor device during the manufacturing process thereof, which is subsequent to FIG. 8.

Next, as shown in FIG. 9, over the upper surface Sa of the semiconductor substrate SS, the interlayer insulating film IL made of, e.g., a PSG (Phosphosilicate Glass) film is formed by, e.g., a CVD method or the like. The interlayer insulating film IL is formed so as to cover the p-type body region PB via, e.g., the insulating film IF in each of the hybrid sub-cell regions LCh1 and LCh2 and the inactive cell regions LCi. The thickness of the interlayer insulating film IL is, e.g., about 0.6 µm. Examples of the material of the interlayer insulating film IL include not only a PSG film, but also a BPSG (Borophosphosilicate Glass) film, an NSG (Non-doped Silicate Glass) film, an SOG (Spin-On-Glass) film, and a composite film thereof.

Next, by an anisotropic dry etching method using a resist pattern as a mask, the contact trenches CT are formed in the interlayer insulating film IL. Examples of a gas for the anisotropic dry etching include a gas mixture including an Ar gas, a CHF$_3$ gas, and a CF$_4$ gas. Subsequently, by the anisotropic dry etching method, the contact trenches CT are extended into the semiconductor substrate SS. As a result, in each of the hybrid sub-cell regions LCh1 and LCh2, the contact trench CT as the opening extending through the interlayer insulating film IL and reaching a middle point in the p-type body region PB is formed. In each of the hybrid sub-cell regions LCh1 and LCh2, the contact trench CT is formed continuously along the Y-axis direction in plan view. Preferred examples of a gas for the anisotropic dry etching include a Cl$_2$/O$_2$ gas.

Next, a p-type impurity is ion-implanted through, e.g., the contact trenches CT to form the p$^+$-type body contact regions PBC. Preferred examples of ion implantation conditions used at this time include, e.g., an ion species of boron, a dose of about 5×10$^{15}$ cm$^{-2}$, and an implantation energy of about 80 keV. When the p$^+$-type body contact regions PBC are formed in the cell formation area AR1, the p$^+$-type body contact region PBCp is formed in, e.g., each of the gate line lead-out area AR2 (see FIG. 2) and a termination area TA (see FIGS. 27 and 28).

Next, through, e.g., the contact trenches CT, a p-type impurity is ion-implanted to form the p$^+$-type latch-up prevention regions PLP. Preferred examples of ion implantation conditions used at this time include, e.g., an ion species of boron, a dose of about 1×10$^{15}$ cm$^{-2}$, and an implantation energy of about 100 keV. The p-type impurity concentration in each of the p$^+$-type body contact regions PBC is higher than the p-type impurity concentration in each of the p$^+$-type latch-up prevention regions PLP.

The p$^+$-type body contact region PBC and the p$^+$-type latch-up prevention region PLP form each of the p$^+$-type semiconductor regions PR. In each of the hybrid sub-cell regions LCh1 and LCh2, in the portion of the p-type body region PB which is exposed in the contact trench CT, the p$^+$-type semiconductor region PR is formed. In each of the hybrid sub-cell regions LCh1 and LCh2, the p$^+$-type semiconductor region PR is formed continuously along the Y-axis direction in plan view.

That is, in the portion of the semiconductor layer SLn which is located between the trenches T1 and T2, the p$^+$-type semiconductor region PR in contact with the p-type body region PB is formed. Also, in the portion of the semiconductor layer SLn which is located between the trenches T1 and T3, the p$^+$-type semiconductor region PR in contact with the p-type body region PB is formed. In each of the hybrid sub-cell regions LCh1 and LCh2, the p-type impurity concentration in the p$^+$-type semiconductor region PR is higher than the p$^+$-type impurity concentration in the p-type body region PB.

Figure 10:
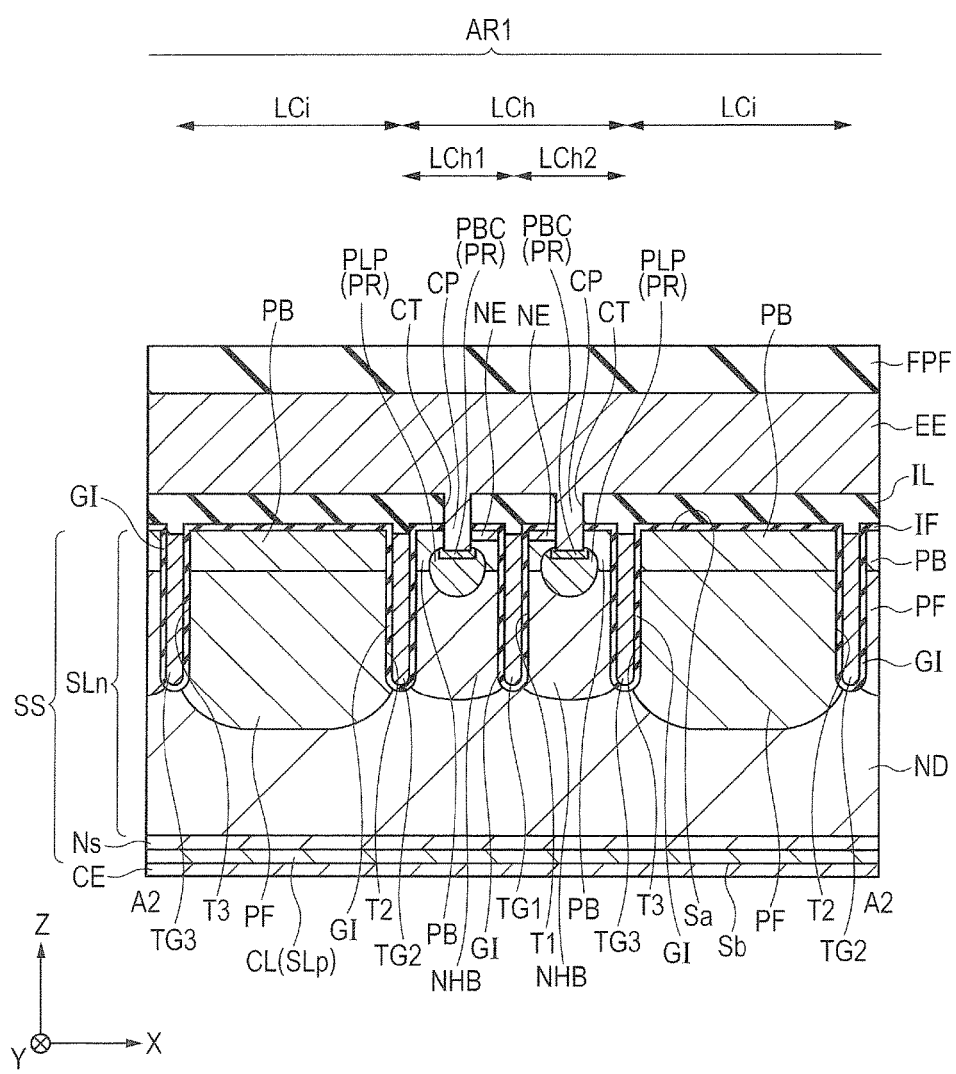
FIG. 10 is a cross-sectional view of the semiconductor device during the manufacturing process thereof, which is subsequent to FIG. 9.

Next, as shown in FIG. 10, the emitter electrode EE is formed. Specifically, the formation of the emitter electrode EE is performed in accordance with, e.g., the following procedure. First, by, e.g., a sputtering method, over the upper surface Sa of the semiconductor substrate SS, a titanium tungsten film is formed as a barrier metal film. The thickness of the titanium tungsten film is, e.g., about 0.2 μm.

Next, after silicide annealing is performed in a nitrogen atmosphere at, e.g., about 600° C. for about 10 minutes, an aluminum-based metal film (containing, e.g., several percent of silicon additive, the balance being aluminum) is formed by, e.g., a sputtering method. The thickness of the aluminum-based metal film is, e.g., about 5 μm.

Next, by a dry etching method using a resist pattern as a mask, the emitter electrode EE including an aluminum-based metal film and a barrier metal film is formed. Preferred examples of a gas for the dry etching include a Cl$_2$/BCl$_3$ gas.

Thus, in the hybrid sub-cell region LCh1, the coupling electrode CP embedded in the contact trench CT and the emitter electrode EE located over the interlayer insulating film IL are formed. In the hybrid sub-cell region LCh1, the coupling electrode CP is formed continuously along the Y-axis direction in plan view. Also, in the hybrid sub-cell region LCh2, the coupling electrode CP embedded in the contact trench CT and the emitter electrode EE located over the interlayer insulating film IL are formed. In the hybrid sub-cell region LCh2, the coupling electrode CP is formed continuously along the Y-axis direction in plan view.

The emitter electrode EE is electrically coupled to the plurality of n$^+$-type emitter regions NE and the plurality of p$^+$-type semiconductor regions PR which are formed in the hybrid sub-cell regions LCh1 via the coupling electrodes CP formed in the hybrid sub-cell regions LCh1. The emitter electrode EE is also electrically coupled to the plurality of n$^+$-type emitter regions NE and the plurality of p$^+$-type semiconductor regions PR which are formed in the hybrid sub-cell regions LCh2 via the coupling electrodes CP formed in the hybrid sub-cell regions LCh2.

Note that, when the emitter electrode EE is formed, the gate electrode GE electrically coupled to the trench electrodes TG1 may also be formed (see FIG. 1). When the emitter electrode EE is formed in the cell formation area AR1, the gate line GL and the gate electrode GE may also be formed in the gate line lead-out area AR2 (see FIG. 1).

Next, over the emitter electrode EE, the insulating film FPF as the passivation film made of an organic film containing, e.g., polyimide as a main component or the like is formed. The thickness of the insulating film FPF is, e.g., about 2.5 μm.

Next, by a dry etching method using a resist pattern as a mask, the insulating film FPF is patterned to be formed with the opening OP1 extending through the insulating film FPF and reaching the emitter electrode EE (see FIG. 1) and form the emitter pad EP made of the portion of the emitter electrode EE which is exposed in the opening OP1 (see FIG. 1).

Note that, when the insulating film FPF is formed over the emitter electrode EE in the cell formation area AR1, the insulating film FPF is formed over the gate electrode GE in the gate line lead-out area AR2 (see FIG. 1). Also, when the opening OP1 is formed in the cell formation area AR1, the opening OP2 extending through the insulating film FPF and reaching the gate electrode GE is formed in the gate line lead-out area AR2. Thus, the gate pad GP made of the portion of the gate electrode GE which is exposed in the opening OP2 is formed (see FIG. 1).

Next, a back grinding process is performed on the lower surface Sb of the semiconductor substrate SS to reduce the thickness of the semiconductor substrate SS from, e.g., about 800 μm to, e.g., about 30 μm to 200 μm as necessary. When a breakdown voltage is, e.g., about 600 V, the final thickness is about 70 μm. As a result, in the portion of the thinned semiconductor substrate SS which is located closer to the lower surface Sb than the semiconductor layer SLn, the semiconductor layer SLp is formed. As necessary, chemical etching for removing damage from the lower surface Sb or the like is also performed.

At this time, in the thinned semiconductor substrate SS, a semiconductor layer which is closer to the lower surface Sb than the semiconductor layer where the n-type field stop region Ns is to be formed and in which the p$^+$-type collector region CL is to be formed is assumed to be the semiconductor layer SLp.

Next, by, e.g., an ion implantation method, an n-type impurity is introduced into the lower surface Sb of the semiconductor substrate SS to form the n-type field stop region Ns. Preferred examples of ion implantation conditions used at this time include, e.g., an ion species of phosphorus, a dose of about $7 \times 10^{12}$ cm$^{-2}$, and an implantation energy of about 350 keV. Then, as necessary, to activate the impurity, laser annealing or the like is performed on the lower surface Sb of the semiconductor substrate SS.

Next, by, e.g., an ion implantation method, a p-type impurity is introduced into the lower surface Sb of the semiconductor substrate SS to form the p$^+$-type collector region CL. Preferred examples of ion implantation conditions used at this time include, e.g., an ion species of boron, a dose of about $1 \times 10^{13}$ cm$^{-2}$, and an implantation energy of about 40 keV. Then, as necessary, to activate the impurity, laser annealing or the like is performed on the lower surface Sb of the semiconductor substrate SS.

That is, in the step of forming the p$^+$-type collector region CL, in the portion of the semiconductor substrate SS which is located closer to the lower surface Sb than the semiconductor layer SLn, the p-type semiconductor layer SLp is formed to form the p$^+$-type collector region CL.

Next, by, e.g., a sputtering method, under the lower surface Sb of the semiconductor substrate SS, the collector electrode CE electrically coupled to the semiconductor layer SLp, i.e., the p$^+$-type collector region CL is formed. Then, by dicing or the like, the semiconductor substrate SS is divided into chip regions, which are sealed as necessary in packages to generally complete the semiconductor devices according to Embodiment 1.

<Configuration of Semiconductor Device in Comparative Example>

Next, using FIGS. 11 and 12, a description will be given of a configuration of a cell formation area in a semiconductor device according to the comparative example studied by the present inventors.

Figure 11:
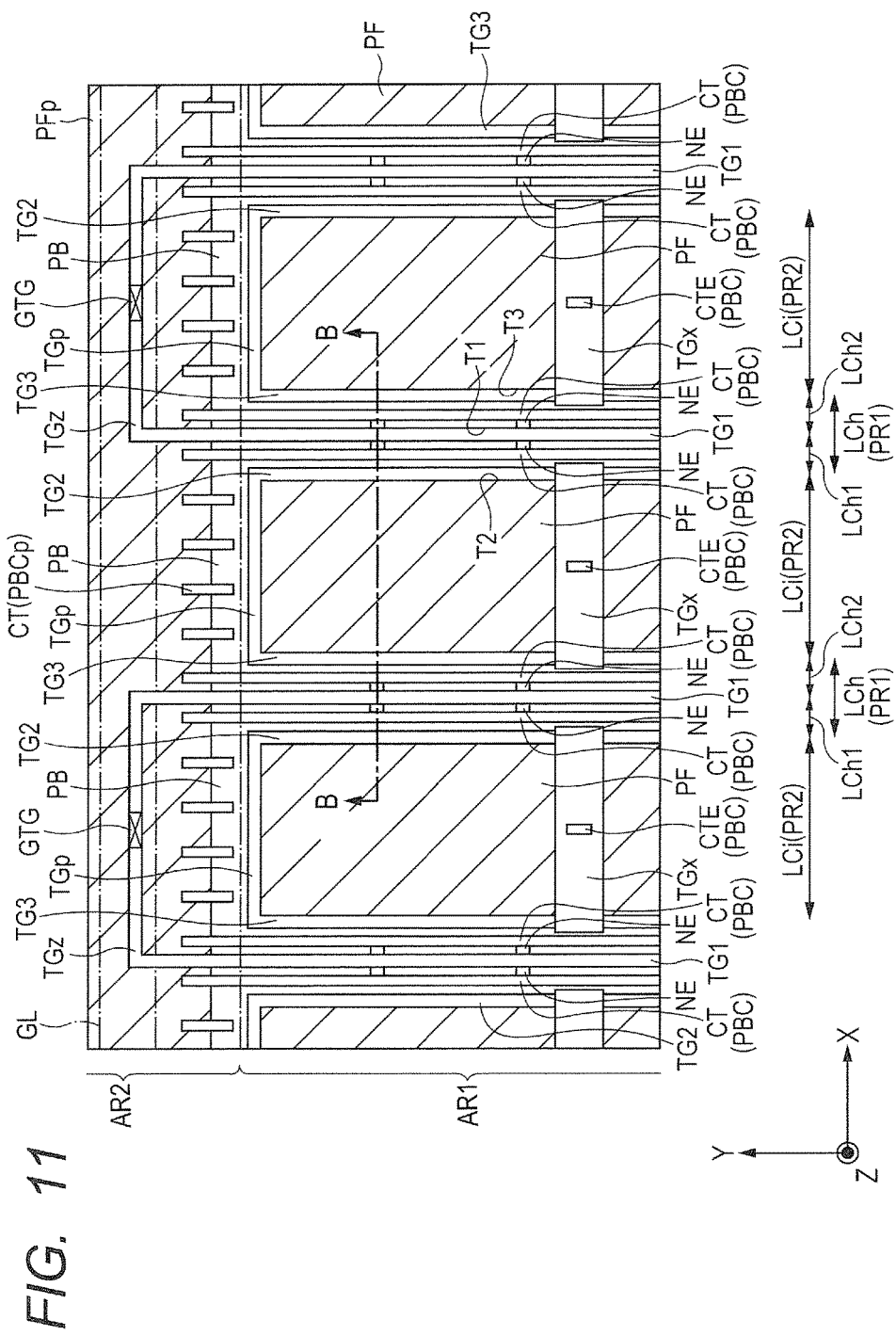
FIG. 11 is a plan view showing a semiconductor device (cell formation area and gate line lead-out area) according to a comparative example.

FIG. 11 is a plan view showing the semiconductor device (cell formation area and gate line lead-out area) according to the comparative example. FIG. 12 is a cross-sectional view along the line B-B in FIG. 11.

Figure 12:
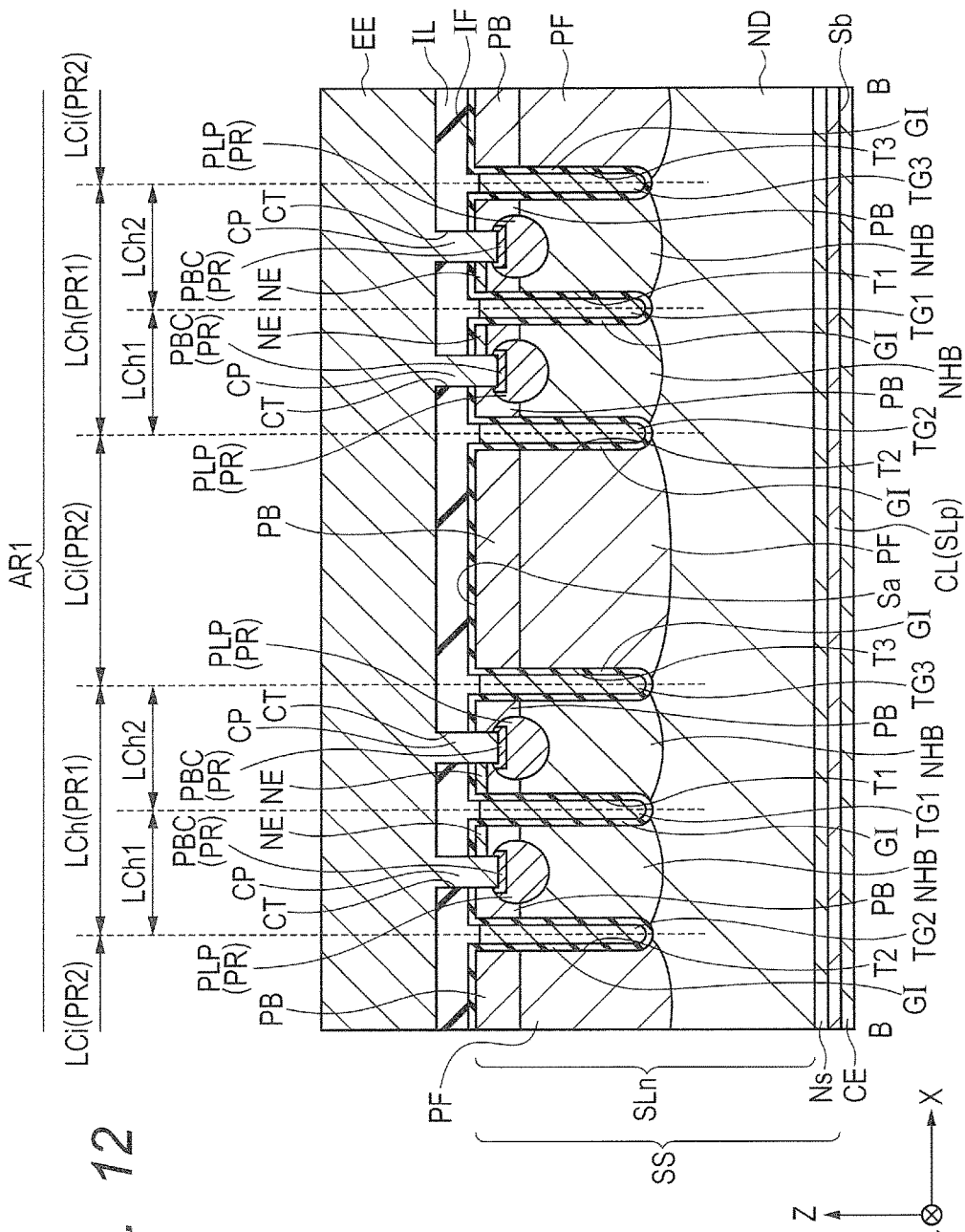
FIG. 12 is a cross-sectional view along the line B-B in FIG. 11.

As shown in FIGS. 11 and 12, in the cell formation area AR1 in the semiconductor device according to the comparative example, in the same manner as in the cell formation area AR1 in the semiconductor device according to Embodiment 1, the plurality of hybrid cell regions LCh as active cell regions and the plurality of inactive cell regions LCi are provided.

Also, the individual components of each of the hybrid cell regions LCh provided in the cell formation area AR1 in the semiconductor device according to the comparative example are the same as the individual components of each of the hybrid cell regions LCh provided in the cell formation area AR1 in the semiconductor device according to Embodiment 1.

Also, the individual components of each of the inactive cell regions LCi provided in the cell formation area AR1 in the semiconductor device according to the comparative example are the same as the individual components of each of the inactive cell regions LCi provided in the cell formation area AR1 in the semiconductor device according to Embodiment 1.

However, the respective plurality of $n^+$-type emitter regions NE formed in the plurality of hybrid cell regions LCh provided in the cell formation area AR1 in the semiconductor device according to the comparative example are symmetrically arranged relative to the inactive region LCi located between the adjacent two hybrid cell regions LCh.

<Advantages of Semiconductor Device in Comparative Example>

Next, using FIGS. 13 and 14, a description will be given of the advantages of the semiconductor device according to the comparative example.

Figure 13:
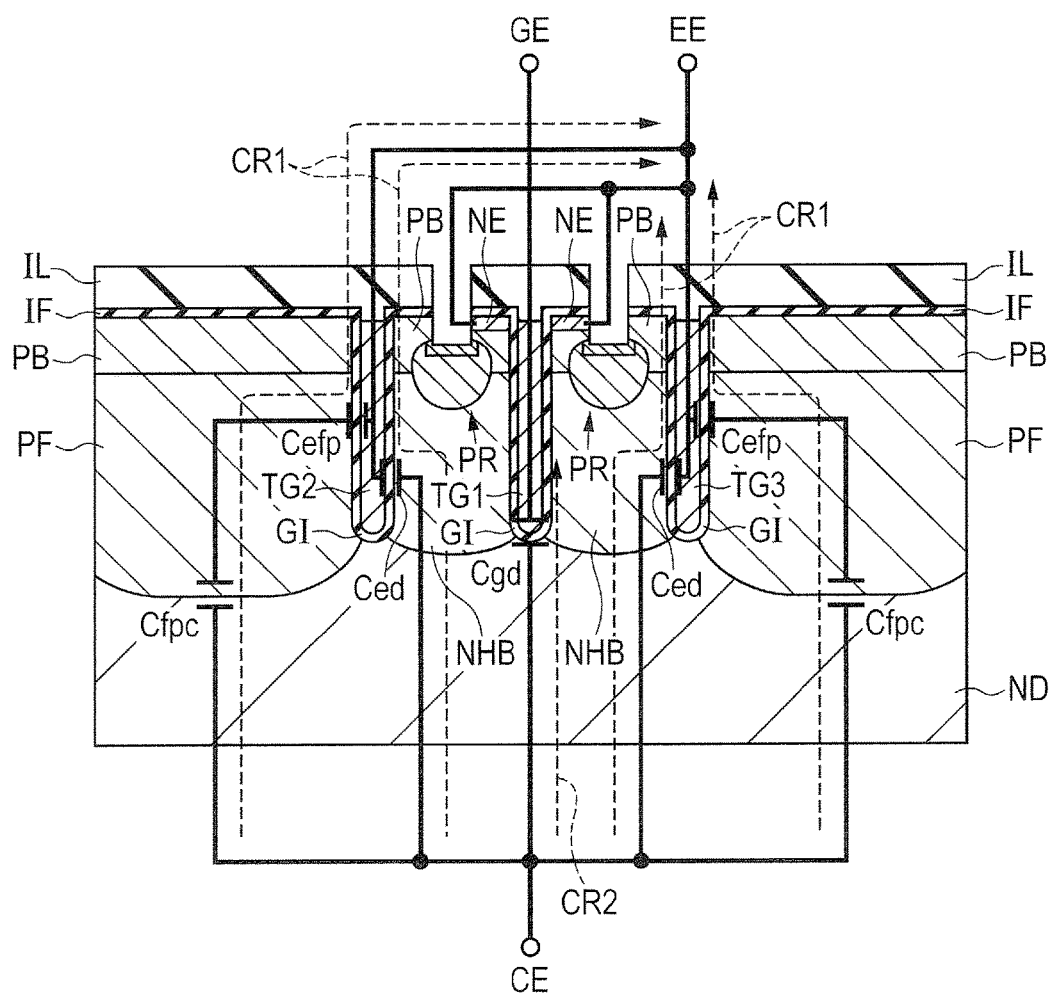
FIG. 13 is a cross-sectional view showing displacement current paths at a turn-ON time in the semiconductor device according to the comparative example in superimposed relation.

FIG. 13 is a cross-sectional view showing displacement current paths at a turn-ON time in the semiconductor device according to the comparative example in superimposed relation. FIG. 14 is an equivalent circuit diagram showing the displacement current paths at the turn-ON time in the semiconductor device according to the comparative example.

Figure 14:
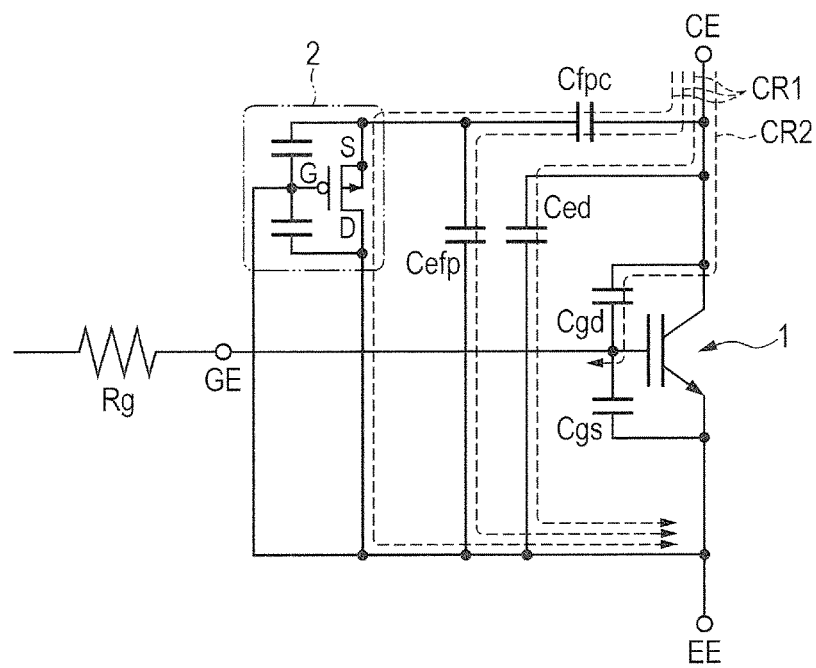
FIG. 14 is an equivalent circuit diagram showing the displacement current paths at the turn-ON time in the semiconductor device according to the comparative example.

Note that the displacement current paths resulting from a rise in collector voltage at a turn-OFF time are the same displacement current paths as the displacement current paths at the turn-ON time shown in FIGS. 13 and 14 except that the displacement currents are shown by oppositely oriented arrows.

As shown in FIGS. 13 and 14, in an IE type trench gate IGBT according to the comparative example, the p-type floating region PF and the trench electrode TG1 coupled to the gate electrode GE are interrupted by each of the trench electrodes TG2 and TG3 coupled to the emitter electrode EE and are not adjacent to each other. The IE type trench gate IGBT according to the comparative example can be represented by an equivalent circuit using an IGBT 1 having the collector electrode CE, the emitter electrode EE, and the gate electrode GE, capacitors Cgd, Cgs, Cfpc, Ced, and Cefp, and a resistor Rg coupled to the gate electrode GE.

In the IE type trench gate IGBT according to the comparative example, a displacement current CR1 generated in the hybrid cell region LCh flows into the emitter electrode EE, but does not flow into the gate electrode GE. Consequently, the influence exerted by the displacement current CR1 on a potential in the gate electrode GE, i.e., gate potential is small. Note that a displacement current CR2 generated in the hybrid cell region LCh may possibly flow into the gate electrode GE via the capacitor Cgd. However, by reducing the capacitor Cgd, it is possible to reduce the influence exerted by the displacement current CR2 on the potential in the gate electrode GE.

Next, referring to FIG. 15, a description will be given of the operation of a p-channel parasitic MOSFET (Metal Oxide Semiconductor Field Effect Transistor) 2 formed in the IGBT 1.

Figure 15:
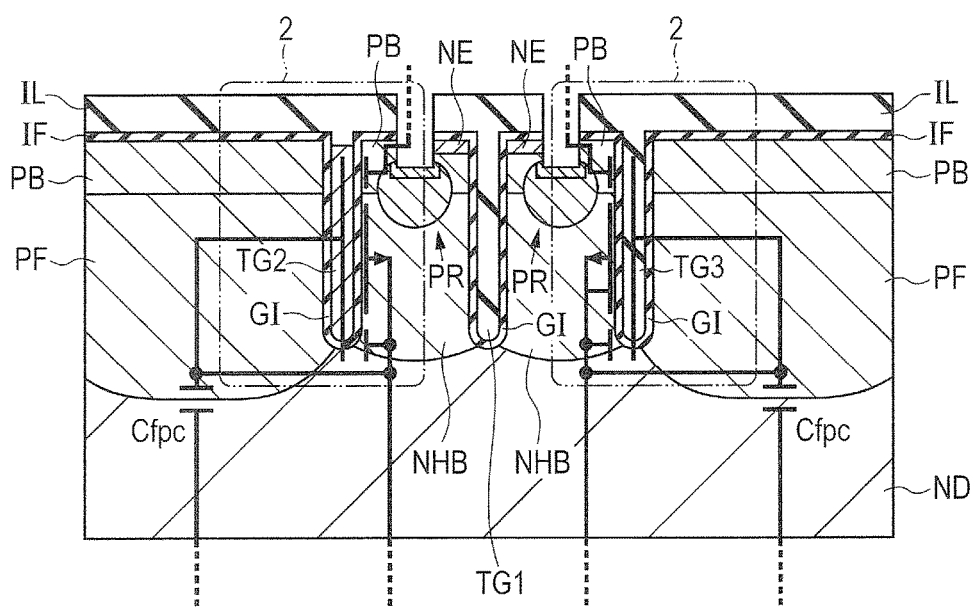
FIG. 15 is a cross-sectional view showing a p-channel parasitic MOSFET in the semiconductor device according to the comparative example.

FIG. 15 is a cross-sectional view showing the p-channel parasitic MOSFET in the semiconductor device according to the comparative example.

By way of example, the following will describe the parasitic MOSFET formed in the IGBT1. However, in the IGBT 1, a parasitic MISFET made of any of various MISFETs (Metal Insulator Semiconductor Field Effect Transistors) other than the MOSFET may also be formed.

The following will also give consideration to an operation when L-load switching is turned OFF. The L-load switching refers to the switching of an IGBT when an inductor having an inductance L is coupled to the collector electrode or emitter electrode of the IGBT. When the L-load switching is turned OFF, first, the voltage VCE as a collector-emitter voltage rises simultaneously with the turning OFF. At this time, the conductivity type of the channel region of the p-channel parasitic MOSFET 2 is inverted to a p-type. Then, holes as carriers stored in the p-type floating region PF and the $n^-$-type drift region ND are discharged through the p-channel parasitic MOSFET 2. By the foregoing operation, the stored holes are promptly discharged and therefore the IE type trench gate IGBT according to the comparative example has the advantage of a high switching speed.

<Problem of Semiconductor Device in Comparative Example>

However, the semiconductor device according to the comparative example also has a problem. The following will describe the problem of the semiconductor device according to the comparative example.

Figure 16:
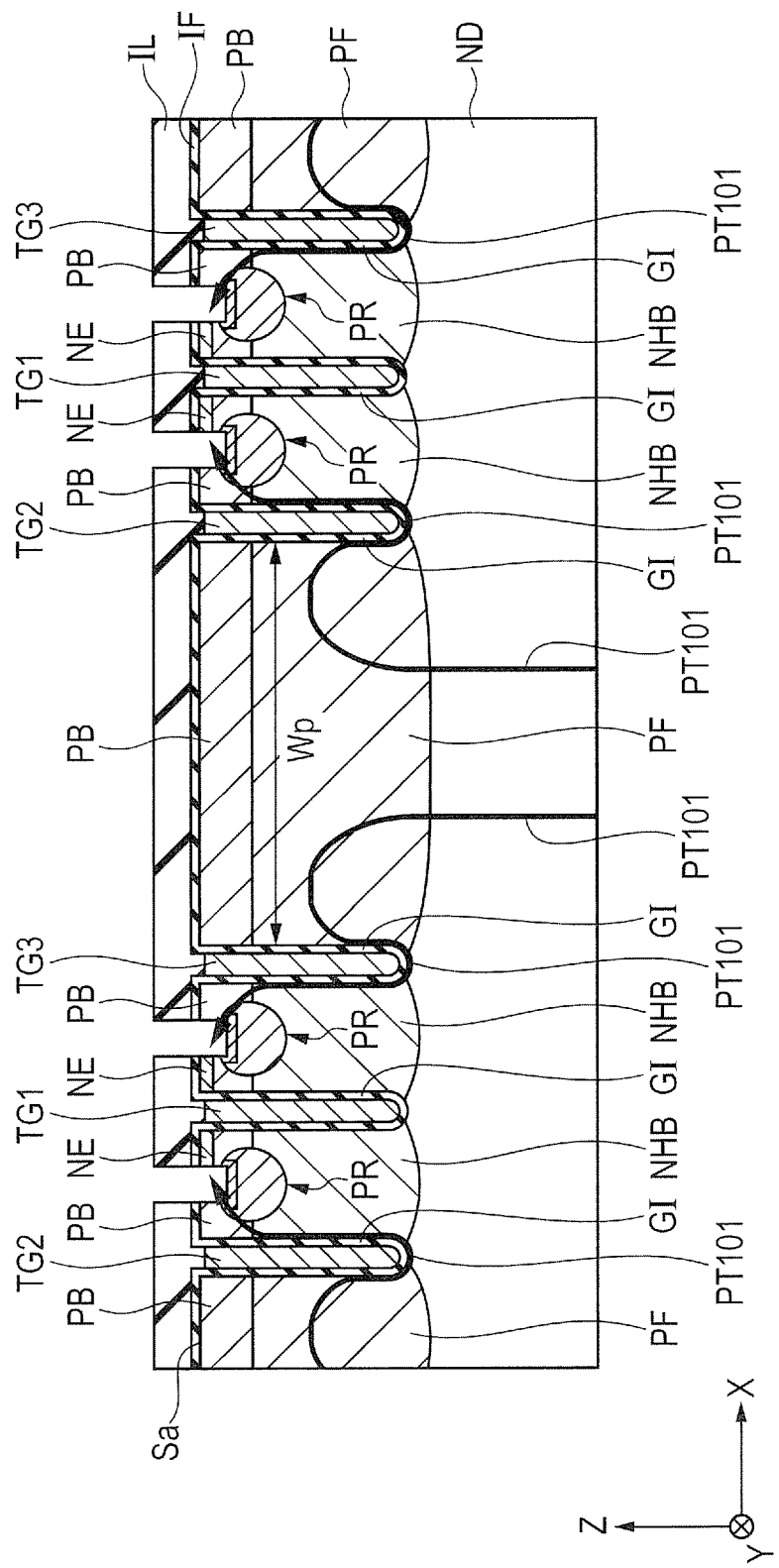
FIG. 16 is a cross-sectional view showing the semiconductor device (cell formation area) according to the comparative example.

Referring to FIG. 16, a description will be given first of a switching loss at the turn-ON time.

FIG. 16 is a cross-sectional view showing the semiconductor device (cell formation area) according to the comparative example. FIG. 16 schematically shows a current path PT101 of a hole current flowing in the p-type floating region PF, i.e., the p-channel parasitic MOSFET at the turn-ON time in superimposed relation.

In the IE type trench gate IGBT, when the IE effect is enhanced, it is possible to more promptly store carriers at the turn-ON time and thus reduce the switching loss at the turn-ON time.

However, in an IE type trench gate IGBT with an EGE structure, holes as carriers are discharged through the p-channel parasitic MOSFET at the turn-ON time to degrade the IE effect and increase the switching loss at the turn-ON time. This means that, when the IE type trench gate IGBT is turned ON, the potential in the channel region of the p-channel parasitic MOSFET rises to bring the parasitic MOSFET into the ON state and consequently holes as carries are discharged. Specifically, as shown in FIG. 16, in the IE type trench gate IGBT, at the turn-ON time, a hole current flows in a current path PT101 extending from the n⁻-type drift region ND through the p-type floating region PF and further extending through the respective portions of the p-type floating region PF, the n-type hole barrier region NHB, and the p-type body region PB which are closer to the trench electrodes TG2 and TG3. During the conduction of the IE type trench gate IGBT (in the ON state) also, holes as carriers are discharged through the p-channel parasitic MOSFET, resulting in a reduction in IE effect.

As a result of the calculation of a switching waveform at the turn-ON time using TCAD (Technology Computer-Aided Design), it was recognized that, when the IE type trench gate IGBT with the EGE structure was turned ON, a potential in the channel region of the p-channel parasitic MOSFET rises, and holes as carriers were discharged, though the illustration thereof is omitted. As a result of the calculation of the distribution of a hole density in the semiconductor device at the turn-ON time, it was also recognized that, when the IE type trench gate IGBT with the EGE structure was turned ON, holes as carriers were discharged through the p-channel parasitic MOSFET.

In general, in the IE type trench gate IGBT, as the width (Wp shown in FIG. 16) of the p-type floating region PF provided in each of the inactive cell regions CLi in the X-axis direction is increased, the resistance to the discharged carriers (holes) increases to enhance the IE effect. As a result, the collector-emitter saturation voltage VCE (sat) decreases. Accordingly, the present inventors have conducted a study in which, in the IE type trench gate IGBT, the width of the p-type floating region PF in the X-axis is increased to improve the IE effect even at the turn-ON time or during the conduction of the IE type trench gate IGBT (in the ON state).

However, as a result of conducting the study, the present inventors have found that, in the semiconductor device including the active cell region with the EGE structure, even though the width of the p-type floating region PF in the X-axis direction is increased, when a specified width is exceeded, the IE effect is not improved.

Figure 17:
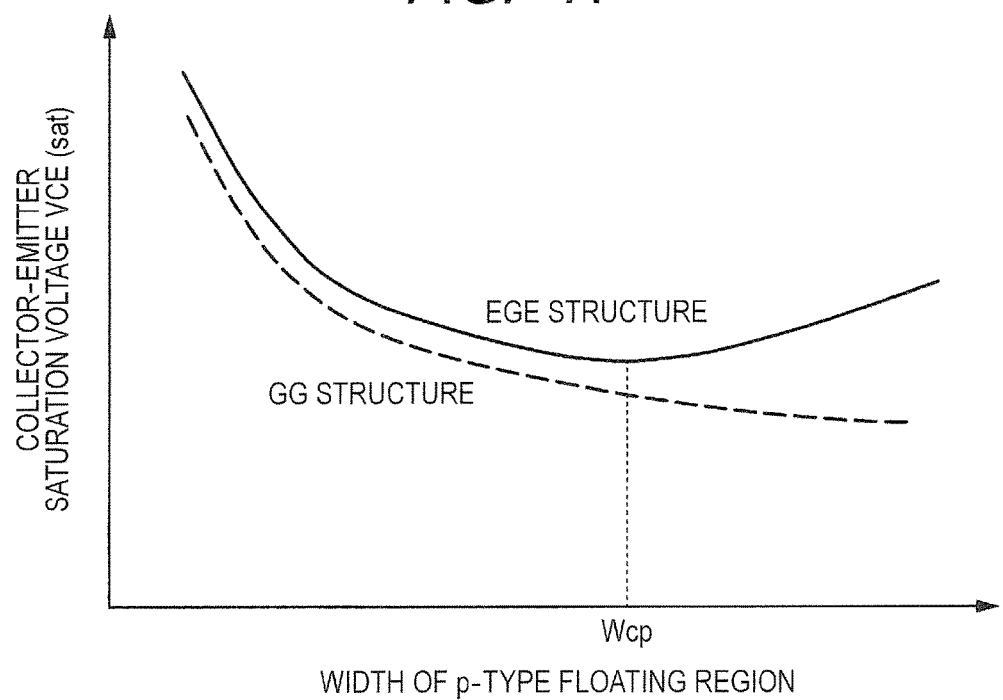
FIG. 17 is a graph showing the relationship between a collector-emitter saturation voltage VCE (sat) and the width of a p-type floating region in an X-axis direction in a semiconductor device including an active cell region with an EGE structure.

FIG. 17 is a graph showing the relationship between the collector-emitter saturation voltage VCE (sat) and the width of the p-type floating region in the X-axis direction in the semiconductor device including the active cell region with the EGE structure. FIG. 17 also shows, as a comparative example, the relationship between the collector-emitter saturation voltage VCE (sat) and the width of the p-type floating region in the X-axis direction in a semiconductor device including an active cell region with a GG structure (gate-gate structure). The GG structure means that each of two trench electrodes disposed to be spaced apart from the active cell region is electrically coupled to a gate electrode.

As shown in FIG. 17, in the semiconductor device including the active cell region with the GG structure, as the width of the p-type floating region increases, the collector-emitter saturation voltage VCE (sat) gradually decreases. By contrast, in the semiconductor device including the active cell region with the EGE structure, as the width of the p-type floating region increases, the collector-emitter saturation voltage VCE (sat) temporarily gradually decreases. However, when the width of the p-type floating region exceeds a specified width Wcp, as the width of the p-type floating region increases, the collector-emitter saturation voltage VCE (sat) gradually increases.

Figure 18:
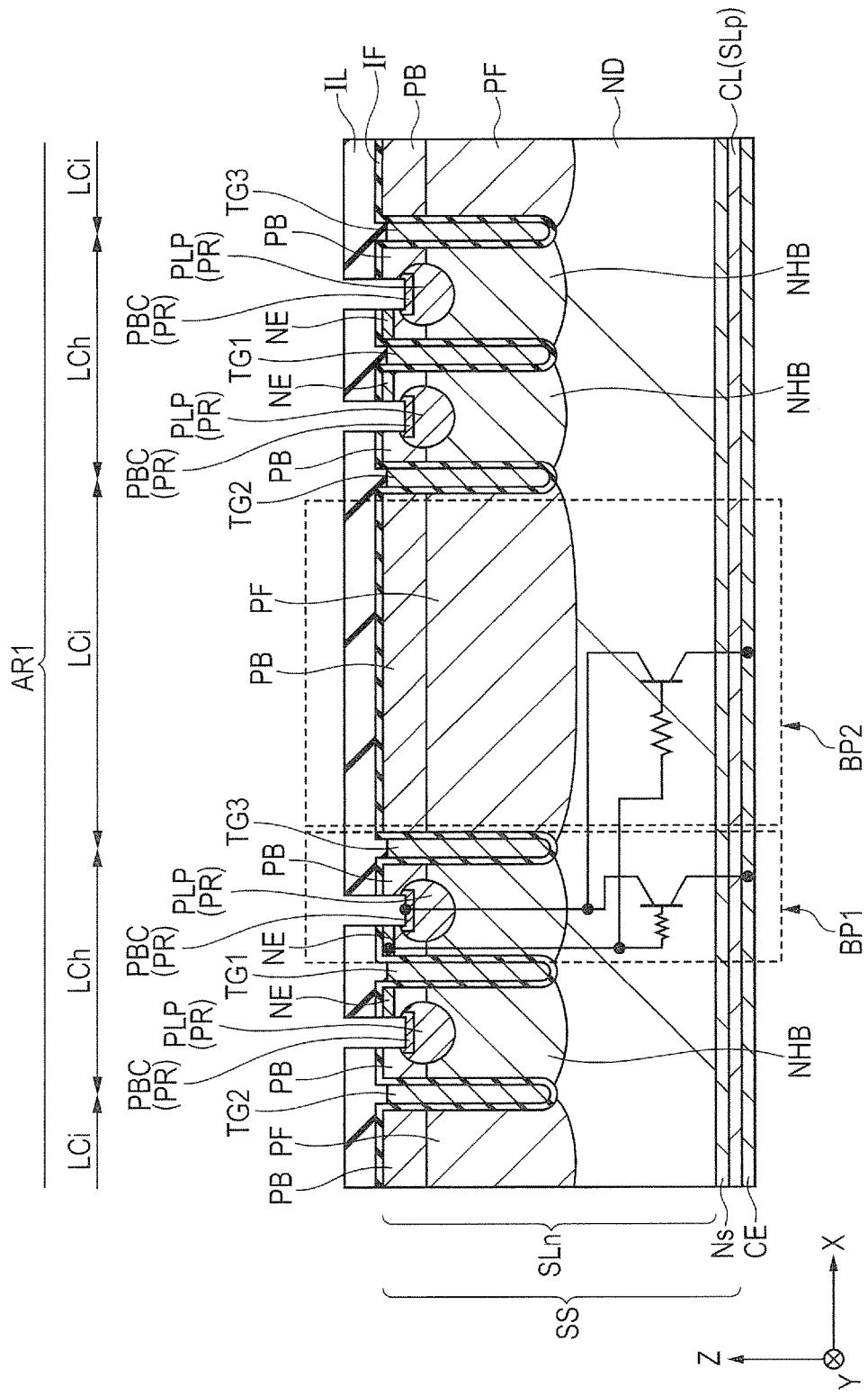
FIG. 18 is a cross-sectional view showing the semiconductor device (cell formation area) according to the comparative example.
Figure 19:
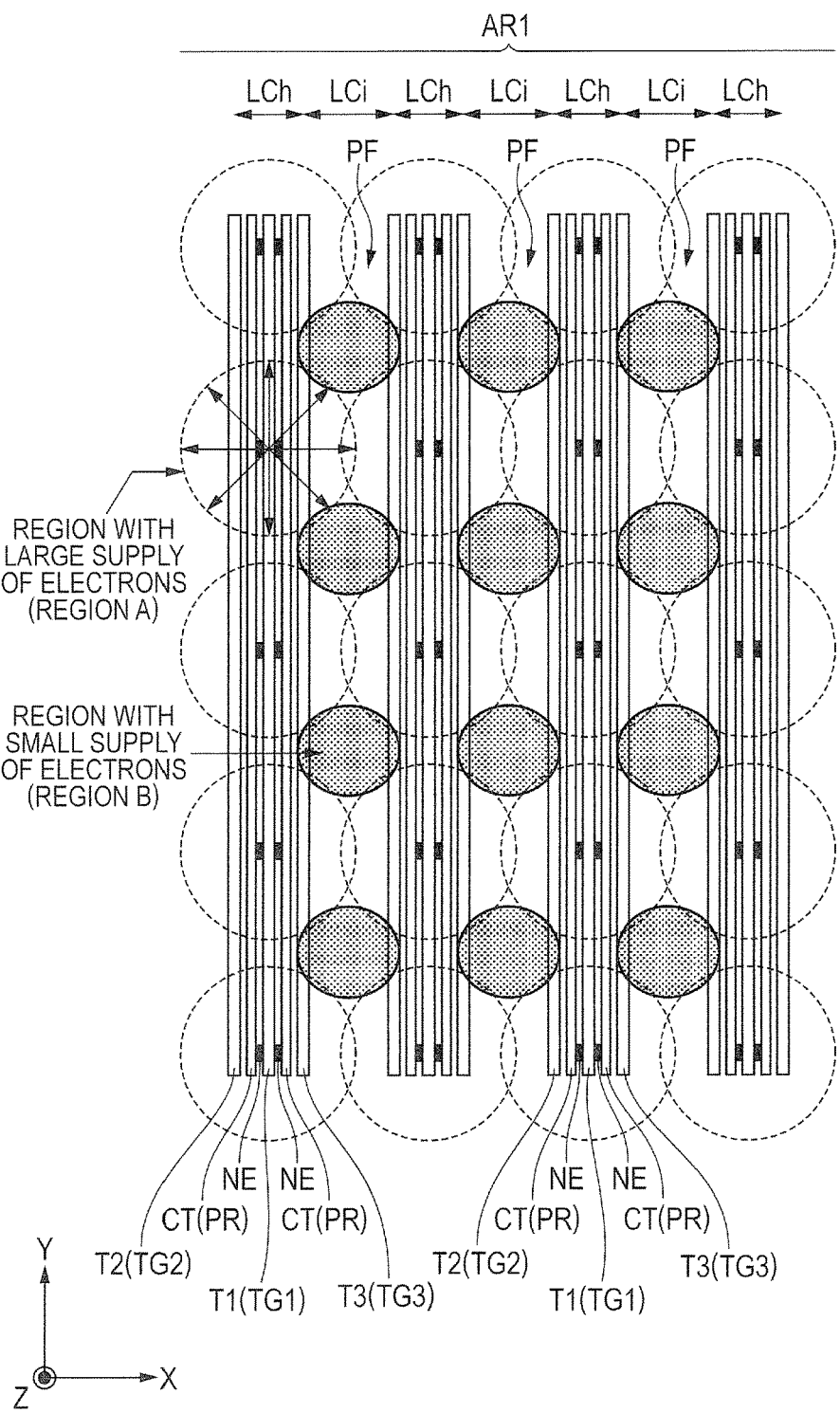
FIG. 19 is a view illustrating regions supplied with electrons in the semiconductor device according to the comparative example.
Figure 20:
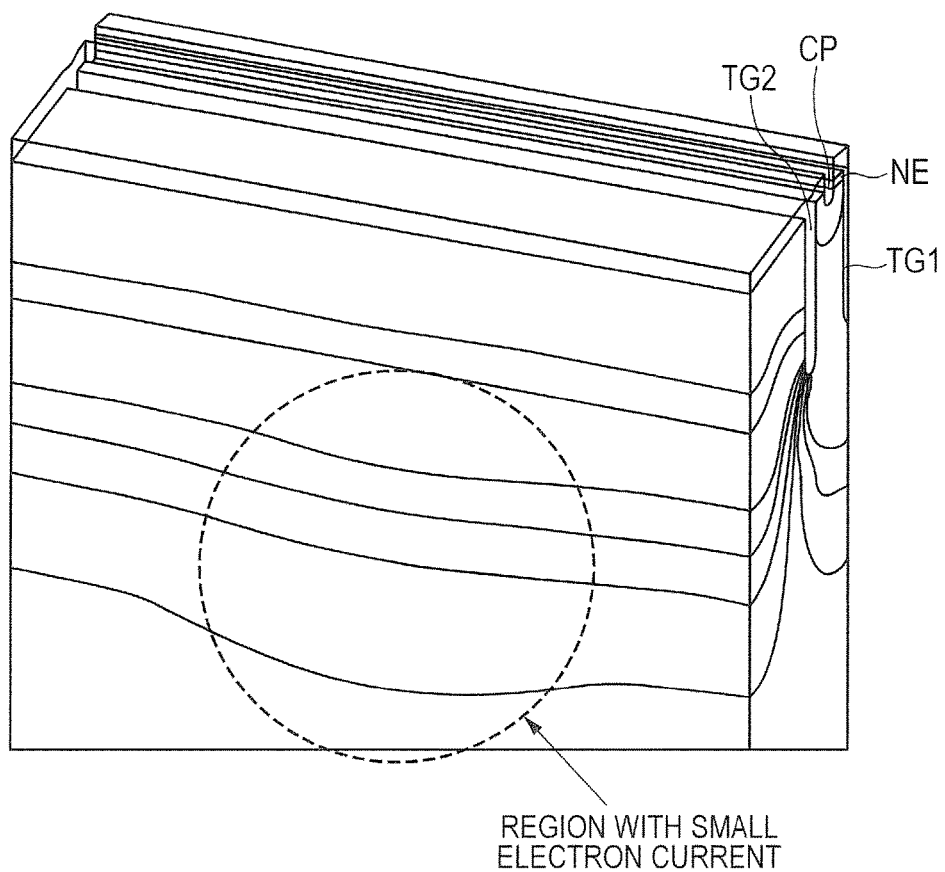
FIG. 20 is a view showing the result of simulating an electron current in the semiconductor device according to the comparative example.

Referring to FIGS. 18 to 20, the following will describe a phenomenon in which the foregoing collector-emitter saturation voltage VCE (sat) increases in the semiconductor device having the active cell region with the EGE structure.

FIG. 18 is a cross-sectional view showing the semiconductor device (cell formation area) according to the comparative example. FIG. 19 is a plan view illustrating regions supplied with electrons in the semiconductor device according to the comparative example. FIG. 20 is a view showing the result of simulating an electron current in the semiconductor device according to the comparative example. Note that, in FIG. 19, for improved clarity of illustration, n⁺-type emitter regions are blacked out.

As shown in FIG. 18, in the cell formation area AR1 in the semiconductor device, a first parasitic pnp bipolar transistor BP1 and a second parasitic pnp bipolar transistor BP2 which operate in an ON state (state where the collector-emitter saturation voltage VCE (sat) is applied to provide conduction between a collector and an emitter) are formed.

The first parasitic pnp bipolar transistor BP1 is formed in the hybrid cell region LCh and includes the p⁺-type collector region CL, the n-type semiconductor regions (n⁻-type drift region ND, n-type hole barrier region NHB, and n⁺-type emitter region NE), and the p⁺-type semiconductor region PR (p⁺-type body contact region PBC and p⁺-type latch-up prevention region PLP). The second parasitic pnp bipolar transistor BP2 is formed in the inactive cell region LCi and includes the p⁺-type collector region CL, the n-type semiconductor regions (n⁻-type drift region ND, n-type hole barrier region NHB, and n⁺-type emitter region NE), and the p⁺-type semiconductor region PR (p⁺-type body contact region PBC and p⁺-type latch-up prevention region PLP).

In general, to improve the IE effect, it is effective to increase the density of carriers (holes) stored in the n⁻-type drift region ND and reduce the resistance of the n⁻-type drift region ND. To achieve this, it is necessary to enhance the function of (activate) each of the first and second parasitic pnp bipolar transistors BP1 and BP2.

A supply of electrons from the n⁺-type emitter region NE serves as a supply of a base current to the first and second parasitic pnp bipolar transistors BP1 and BP2. Accordingly, to enhance the function of (activate) each of the first and second parasitic pnp bipolar transistors BP1 and BP2, it is necessary to supply sufficient electrons to each of the first and second parasitic pnp bipolar transistors BP1 and BP2. However, the distance from the n⁺-type emitter region NE from which electrons are supplied to the second parasitic pnp bipolar transistor BP2 formed in the inactive cell region LCi is longer than the distance from the n⁺-type emitter region NE from which electrons are supplied to the first parasitic pnp bipolar transistor BP1 formed in the hybrid cell region LCh.

Accordingly, even though the width of the p-type floating region PF is increased to reduce the collector-emitter saturation voltage VCE (sat), when the width of the p-type floating region PF becomes larger than the specified width (e.g., the width Wcp shown in FIG. 17), the base current (electron current) supplied to the second parasitic pnp bipolar transistor BP2 decreases. This degrades the function of (inactivates) the second parasitic pnp bipolar transistor BP2 and degrades the IE effect. As a result, the collector-emitter saturation voltage VCE (sat) increases.

As shown in FIG. 19, in the cell formation area AR1 in the semiconductor device according to the comparative example, the respective plurality of n⁺-type emitter regions NE formed in the adjacent two hybrid cell regions LCh are symmetrically arranged relative to the inactive region LCi located between the two hybrid cell regions LCh. In other words, the n⁺-type emitter regions NE are arranged at the respective positions (lattice points) where a plurality of first virtual lines extending over the n$^+$-type emitter regions NE along the X-axis direction cross a plurality of second virtual lines extending over the n$^+$-type emitter regions NE along the Y-axis direction. Such an arrangement of the plurality of n$^+$-type emitter regions NE will be hereinafter referred to as a rectangular lattice arrangement.

A region (which may be hereinafter referred to also as a region A) enclosed around each of the plurality of n$^+$-type emitter regions NE to have a radius of a given distance is the region to which a large number of electrons are supplied from each of the plurality of n$^+$-type emitter regions NE. The regions A with a large supply of electrons correspond to the circular regions enclosed by the dotted lines in FIG. 19 and substantially overlap the hybrid cell regions LCh in plan view. Accordingly, the first parasitic pnp bipolar transistor BP1 shown in FIG. 18 has the enhanced function (is activated).

However, when the width of the p-type floating region PF in the X-axis direction is large, a region (which may be hereinafter referred to also as a region B) surrounded by the four n$^+$-type emitter regions NE adjacent to each other in the X-axis direction and in the Y-axis direction in plan view and located outside the foregoing regions A with a large supply of electrons is a region to which a small number of electrons are supplied from each of the n$^+$-type emitter regions NE.

As is also obvious from the simulation result shown in FIG. 20, with an increasing distance from each of the n$^+$-type emitter regions NE, the number of electrons supplied from the n$^+$-type emitter region NE decreases.

The regions B with a small supply of electrons correspond to the dot-hatched circular regions enclosed by the solid lines in FIG. 19 and substantially overlap the inactive regions LCi in plan view. Accordingly, the second parasitic pnp bipolar transistor BP2 shown in FIG. 18 has the degraded function (is inactivated).

Thus, in the cell formation area AR1 in the semiconductor device according to the comparative example, a base current (electron current) supplied to the second parasitic pnp bipolar transistor BP2 in the inactive cell region LCi which operates during the conduction of the semiconductor device (in the ON state) is reduced to degrade the function of (inactivate) the second parasitic pnp bipolar transistor. As a result, the IE effect deteriorates, while the collector-emitter saturation voltage VCE (sat) conversely increases.

As described above, in the semiconductor device according to the comparative example, it is desired to improve the IE effect to thus reduce the switching loss at the turn-ON time and reduce the collector-emitter saturation voltage VCE (sat).

<Main Advantages and Effects of Semiconductor Device in Embodiment 1>

Next, using FIGS. 21 and 22, a description will be given of the main advantages and effects of the semiconductor device according to Embodiment 1.

Figure 21:
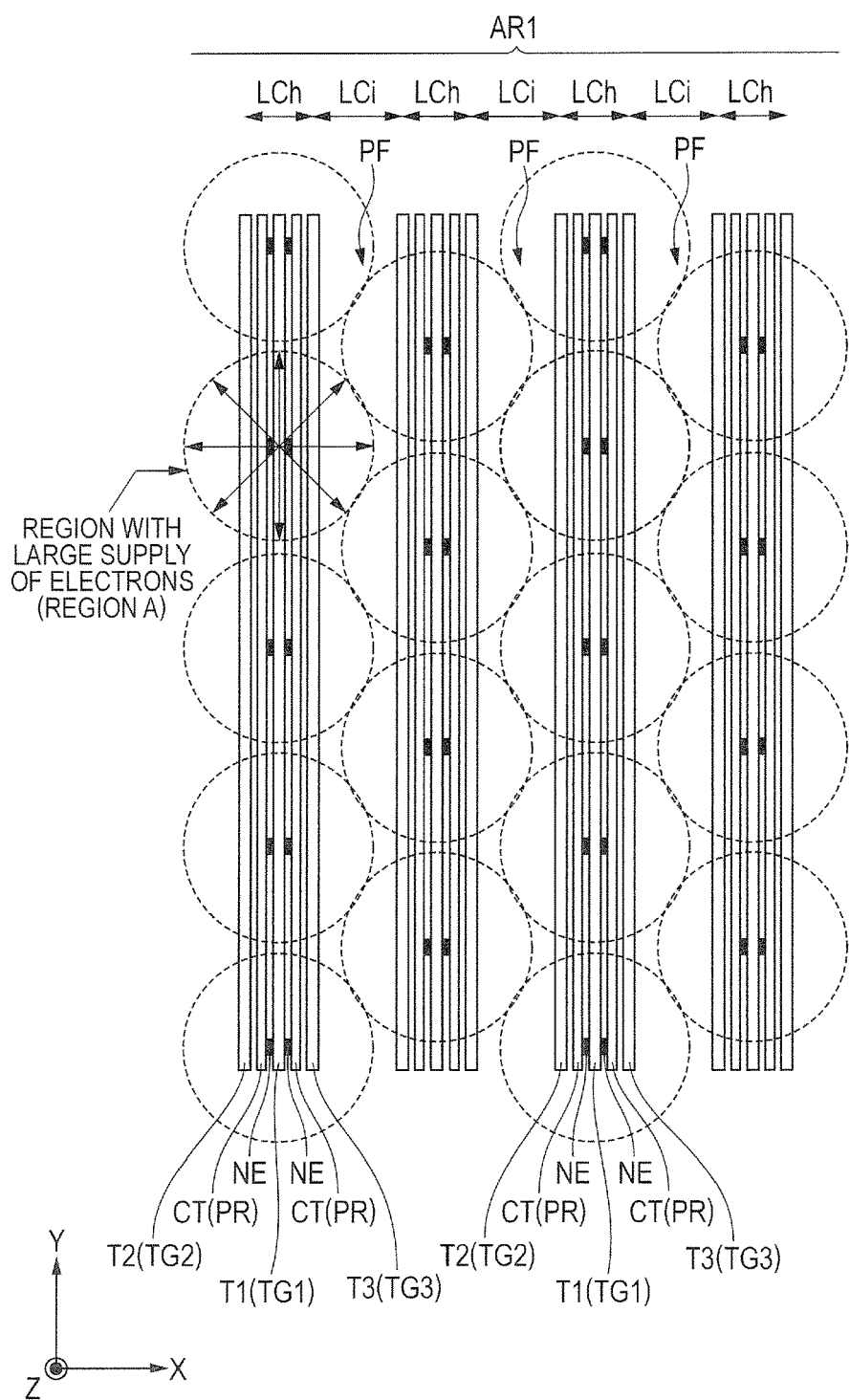
FIG. 21 is a plan view illustrating regions supplied with electrons in the semiconductor device according to Embodiment 1.

FIG. 21 is a plan view illustrating regions supplied with electrons in the semiconductor device according to Embodiment 1. FIG. 22 is a graph showing an example of operation waveforms in the respective semiconductor devices according to Embodiment 1 and the comparative example. Note that, in FIG. 21, for improved clarity of illustration, the n$^+$-type emitter regions are blacked out.

As shown in FIG. 21, in the cell formation area AR1 in the semiconductor device according to Embodiment 1, in each of the hybrid cell regions LCh, the plurality of n$^+$-type emitter regions NE are spaced apart at regular intervals in the Y-axis direction in plan view. However, the respective plurality of n$^-$-type emitter regions NE formed in the two hybrid cell regions LCh adjacent to each other in the X-axis direction are not symmetrically arranged relative to the inactive cell region LCi interposed between the two hybrid cell regions LCh, but are arranged to be staggered or offset from each other by a distance corresponding to half the interval between adjacent two of the n$^+$-type emitter regions NE in the Y-axis direction.

Specifically, with regard to two of the hybrid cell regions LCh which are adjacent to each other in the X-axis direction, one of the plurality of n$^+$-type emitter regions NE formed in one of the adjacent two hybrid cell regions LCh is disposed in the X-direction from the region interposed between two of the plurality of n$^+$-type emitter regions NE formed in the other of the adjacent two hybrid cell regions LCh which are adjacent to each other in the Y-axis direction. In other words, in the cell formation area AR1, the plurality of n$^+$-type emitter regions NE are arranged in a so-called staggered configuration in plan view. In still other words, in the cell formation area AR1, a basic pattern in which the n$^+$-type emitter regions NE are located at individual vertices of a triangle is consecutively arranged in plan view.

The region A enclosed around each of the plurality of n$^-$-type emitter regions NE to have a radius of a given distance is the region to which a large number of electrons are supplied from each of the plurality of n$^+$-type emitter regions NE. By arranging the plurality of n$^+$-type emitter regions NE in a staggered configuration, it is possible to cover substantially the entire cell formation area AR1 with the regions A with a large supply of electrons in plan view. That is, the regions A with a large supply of electrons correspond to the circular regions enclosed by the dotted lines in FIG. 21 and substantially overlap the hybrid cell regions LCh and the inactive cell regions LCi. This can reduce the areas of the regions B with a small supply of electrons which are formed in the cell formation area AR1 in the semiconductor device according to the comparative example (see FIG. 19). As a result, it is possible to supply sufficient electrons to substantially the entire cell formation area AR1.

Accordingly, in the cell formation area AR1 in the semiconductor device according to Embodiment 1, the base current (electron current) supplied to the second parasitic pnp bipolar transistor BP2 in each of the inactive cell regions LCi which operates during the conduction of the semiconductor device (in the ON state) is increased to enhance the function of (activate) the second parasitic pnp bipolar transistor BP2. This improves the IE effect and, even when the width of the p-type floating region PF in the X-axis direction is increased, it is possible to reduce the collector-emitter saturation voltage VCE (sat).

Figure 22:
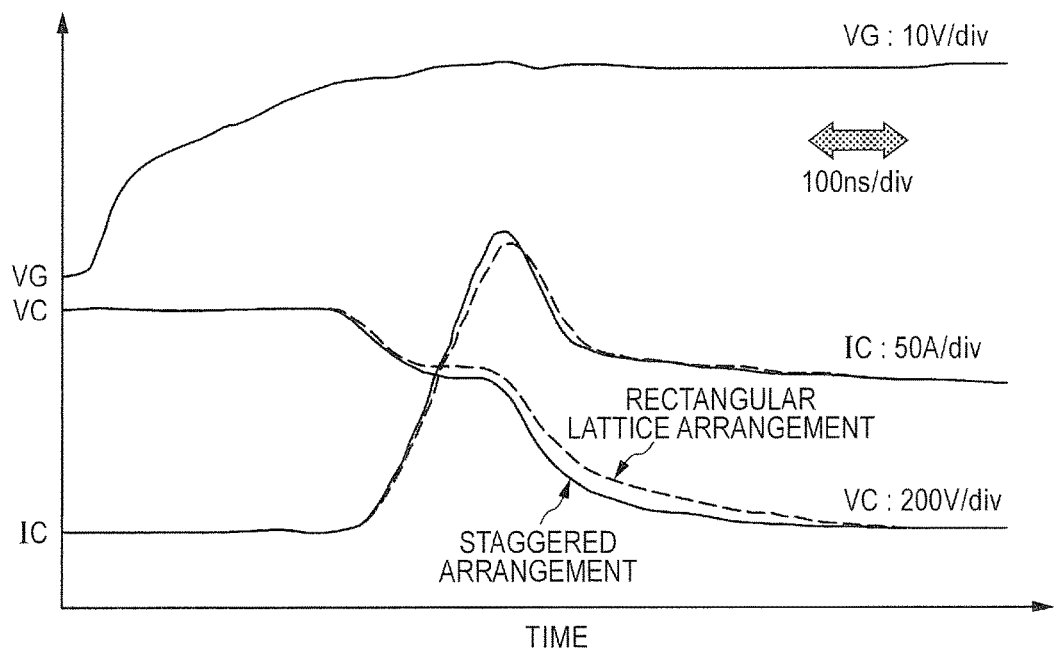
FIG. 22 is a graph showing an example of operation waveforms in the respective semiconductor devices according to Embodiment 1 and the comparative example.

FIG. 22 is a graph showing the respective waveforms of an input signal, an ON voltage, and an ON current when L-load switching is turned ON in each of the respective semiconductor devices according to Embodiment 1 and the comparative example. In FIG. 22, VG denotes the input signal at the turn-ON time, VC denotes a collector voltage, and IC denotes a collector current. The collector voltage VC and the collector current IC in the semiconductor device according to Embodiment 1 are shown by the solid lines (staggered arrangement), while the collector voltage and the collector current in the semiconductor device according to the comparative example are shown by the dotted lines (rectangular lattice arrangement). Note that the L-load switching refers to the switching of an IGBT when an inductor having the inductance L is coupled as a load to the collector electrode or emitter electrode of the IGBT.

In the cell formation area AR1 in the semiconductor device according to Embodiment 1, the plurality of $n^+$-type emitter regions NE are arranged in the staggered configuration in plan view as shown in, e.g., FIG. 21. On the other hand, in the cell formation area AR1 in the semiconductor device according to the comparative example, the plurality of $n^+$-type emitter regions NE are arranged in the rectangular lattice configuration in plan view as shown in, e.g., FIG. 19. The components of the two semiconductor devices are otherwise substantially the same.

As shown in FIG. 22, the ON voltage rises at a higher speed in the semiconductor device according to Embodiment 1 than in the semiconductor device according to the comparative example. It can be seen that, in the semiconductor device according to Embodiment 1, the switching loss in the semiconductor device according to the comparative example has been reduced by about 10 percent. It can be considered that, by arranging the plurality of $n^+$-type emitter regions NE in the staggered arrangement in the cell formation area AR1, the IE effect is improved and consequently a transient carrier storage speed at the turn-ON time is improved.

Thus, in the semiconductor device according to Embodiment 1, by reducing the areas of the regions with a small supply of the base current (electron current), it is possible to supply sufficient electrons to the entire cell formation area AR1 and thus improve the IE effect. This can reduce the switching loss at the turn-ON time and reduce the collector-emitter saturation voltage VCE (sat).

<Configuration of Semiconductor Device in Modification of Embodiment 1>

Using FIGS. 23 and 24, a description will be given of a configuration of an IE type trench gate IGBT included in a semiconductor device according to a modification of Embodiment 1.

Figure 23:
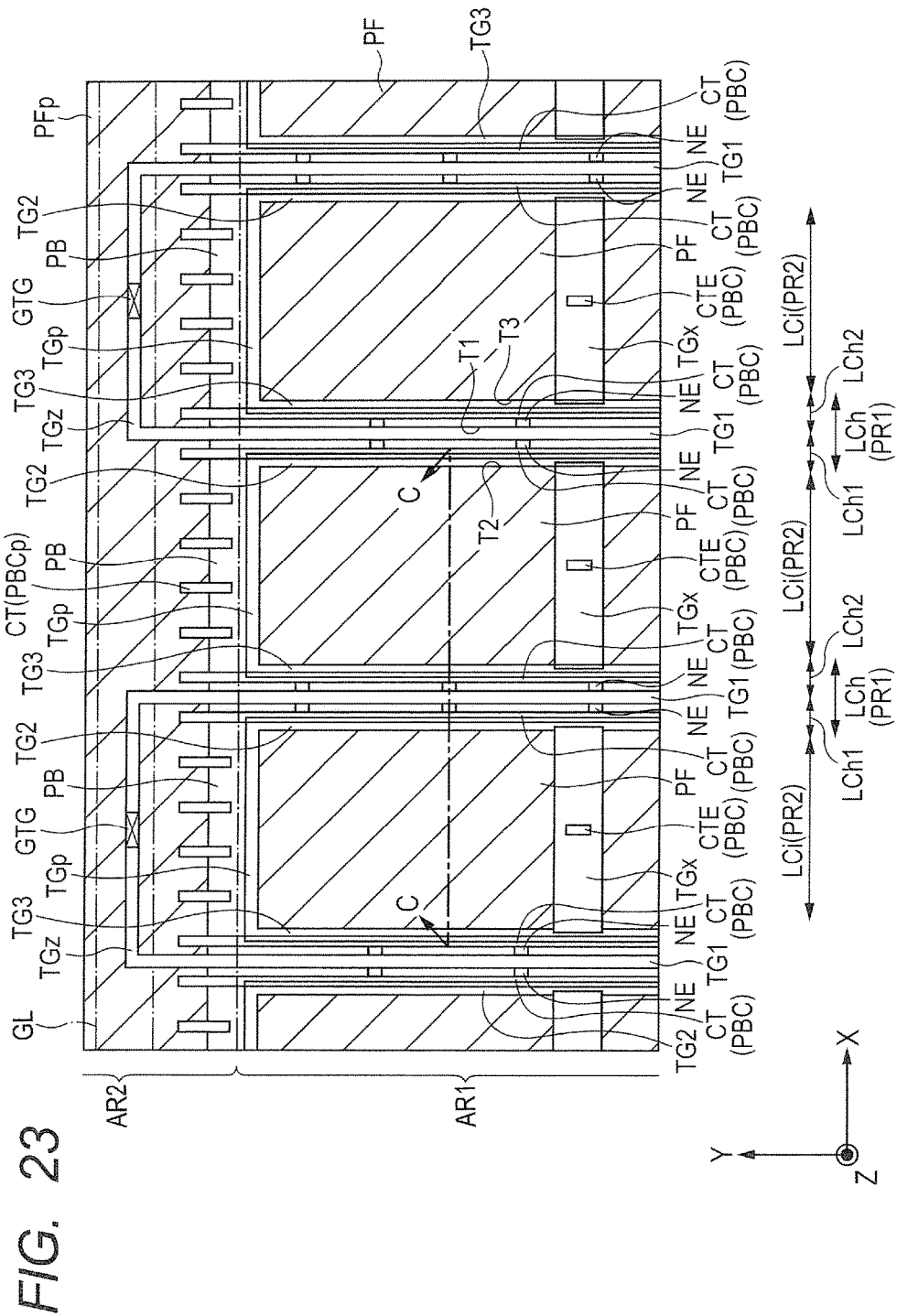
FIG. 23 is a plan view showing a semiconductor device (cell formation area and gate line lead-out area) according to a modification of Embodiment 1.
Figure 24:
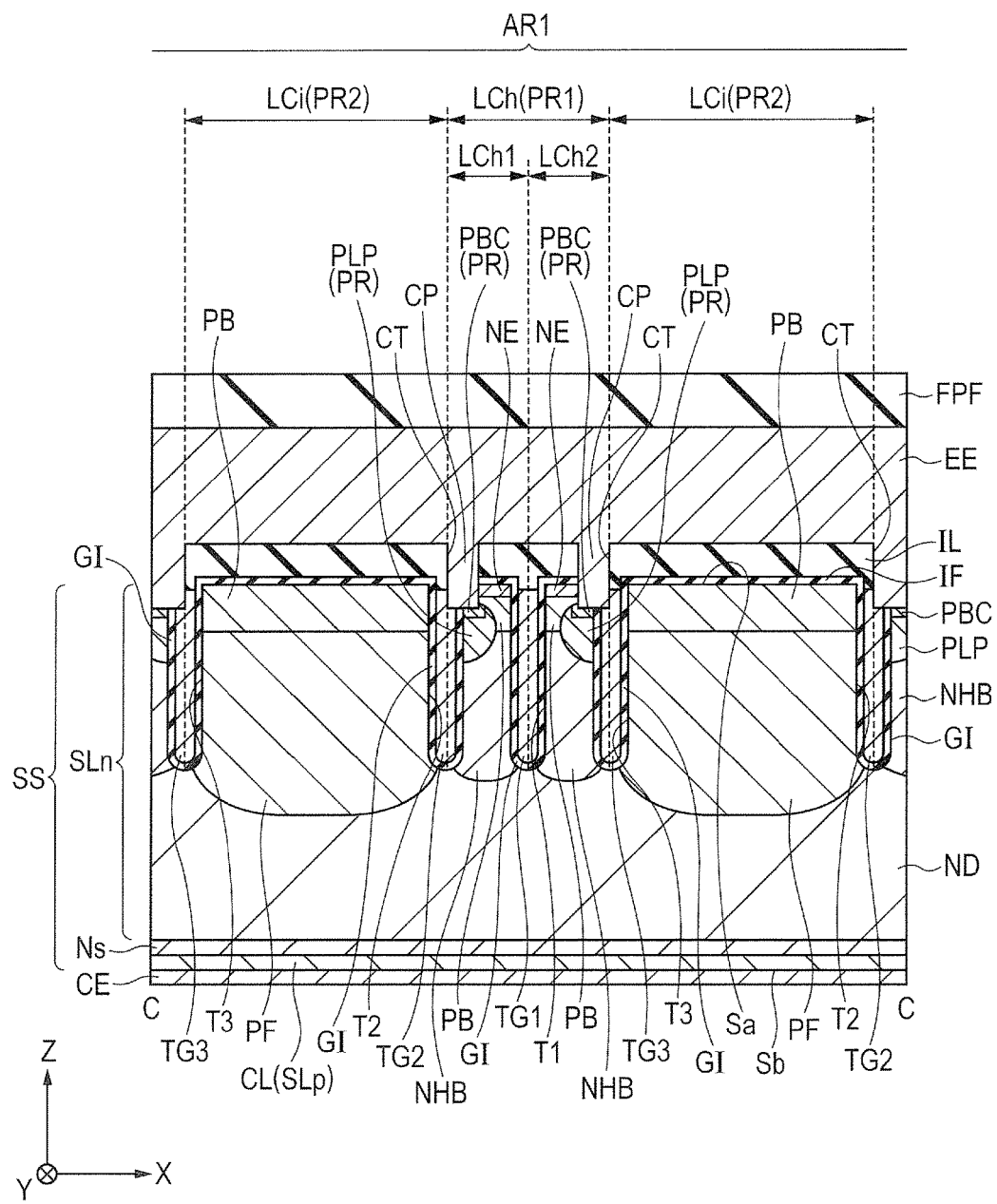
FIG. 24 is a cross-sectional view along the line C-C in FIG. 23.

FIG. 23 is a plan view showing the semiconductor device (cell formation area and gate line lead-out area) according to the modification of Embodiment 1. FIG. 24 is a cross-sectional view along the line C-C in FIG. 23.

The configuration of the IE type trench gate IGBT according to the modification of Embodiment 1 is the same as the configuration (see FIGS. 2 to 4) of the IE type trench gate IGBT according to Embodiment 1 described above except that the coupling electrodes CP individually overlap the trench electrodes TG2 and TG3 in plan view. Accordingly, the following will mainly describe the difference from the configuration of the IE type trench gate IGBT according to Embodiment 1 described above.

In the IE type trench gate IGBT according to the modification of Embodiment 1, in the same manner as in the IE type trench gate IGBT according to Embodiment 1 described above, the plurality of $n^+$-type emitter regions NE are formed in each of the hybrid sub-cell regions LCh1 and LCh2.

Also, in the IE type trench gate IGBT according to the modification of Embodiment 1, in the same manner as in the IE type trench gate IGBT according to Embodiment 1 described above, in the hybrid sub-cell region LCh1, the $p^+$-type semiconductor region PR is formed continuously along the Y-axis direction. Also, in the hybrid sub-cell region LCh1, the contact trench CT as an opening is formed continuously along the Y-axis direction in the $p^+$-type body region PB. The contact trench CT reaches the $p^+$-type body contact region PBC disposed in the hybrid sub-cell region LCh1.

Also, in the IE type trench gate IGBT according to the modification of Embodiment 1, in the same manner as in the IE type trench gate IGBT according to Embodiment 1 described above, in the hybrid sub-cell region LCh2, the $p^+$-type semiconductor region PR is formed continuously along the Y-axis direction. Also, in the hybrid sub-cell region LCh2, the contact trench CT as the opening is formed continuously along the Y-axis direction in the $p^+$-type body region PB. The contact trench CT reaches the $p^+$-type body contact region PBC disposed in the hybrid sub-cell region LCh2.

On the other hand, in the IE type trench gate IGBT according to the modification of Embodiment 1, unlike in the IE type trench gate IGBT according to Embodiment 1 described above, the contact trench CT overlaps the trench T2 in the hybrid sub-cell region LCh1 in plan view, while the contact trench CT overlaps the trench T3 in the hybrid sub-cell region LCh2 in plan view.

In the hybrid sub-cell region LCh1, the $p^+$-type semiconductor region PR is in contact with the gate insulating film GI formed over the inner wall of the trench T2 while, in the hybrid sub-cell region LCh2, the $p^+$-type semiconductor region PR is in contact with the gate insulating film GI formed over the inner wall of the trench T3.

<Main Advantages and Effects of Semiconductor Device in Modification of Embodiment 1>

In the semiconductor device according to the modification of Embodiment 1 also, in the same manner as in the semiconductor device according to Embodiment 1 described above, in the cell formation area AR1, the plurality of $n^+$-type emitter regions NE are arranged in a staggered configuration in plan view.

Accordingly, in the semiconductor device according to the modification of Embodiment 1 also, in the same manner as in the semiconductor device in Embodiment 1 described above, it is possible to improve the IE effect, reduce the switching loss at the turn-ON time, and reduce the collector-emitter saturation voltage VCE (sat).

On the other hand, in the IE type trench gate IGBT according to the modification of Embodiment 1, unlike in the IE type trench gate IGBT according to Embodiment 1 described above, the coupling electrode CP and the trench electrode TG2 which are formed in the hybrid sub-cell region LCh1 overlap each other in plan view, while the coupling electrode CP and the trench electrode TG3 which are formed in the hybrid sub-cell region LCh2 overlap each other in plan view. That is, in the IE type trench gate IGBT according to the modification of Embodiment 1, the widths of the portions of the semiconductor layer SLn which are located between the trenches T1 and T2 and between the trenches T1 and T3 are smaller than in the IE type trench gate IGBT according to Embodiment 1 described above.

Accordingly, in the semiconductor device according to the modification of Embodiment 1, the resistance to the discharged holes as carriers increases compared to that in the semiconductor device according to Embodiment 1 described above. As a result, the holes are more likely to be stored in the portion of the $n^-$-type drift region ND which is closer to the emitter electrode EE to increase the efficiency of electron injection from the emitter electrode EE and further improve the IE effect. Therefore, in the semiconductor device according to the modification of Embodiment 1, the performance of the semiconductor device can further be improved compared to that of the semiconductor device according to Embodiment 1 described above.

Embodiment 2

<Configuration and Problem of Semiconductor Device in Comparative Example>

First, using FIGS. 25 and 26, a description will be given of a configuration of a cell formation area in a semiconductor device according to a comparative example studied by the present inventors.

Figure 25:
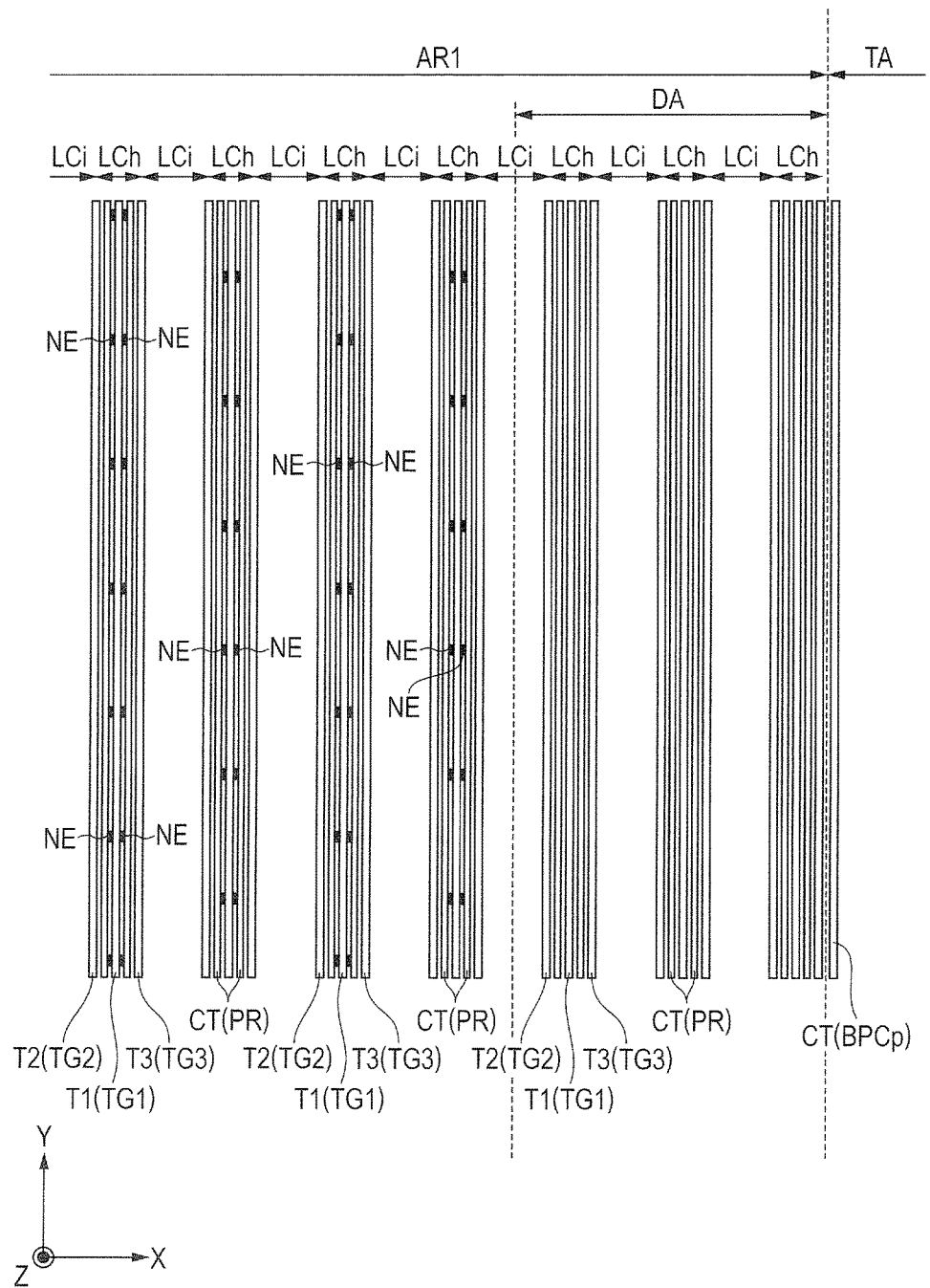
FIG. 25 is a plan view showing the semiconductor device (cell formation area) according to the comparative example.
Figure 26:
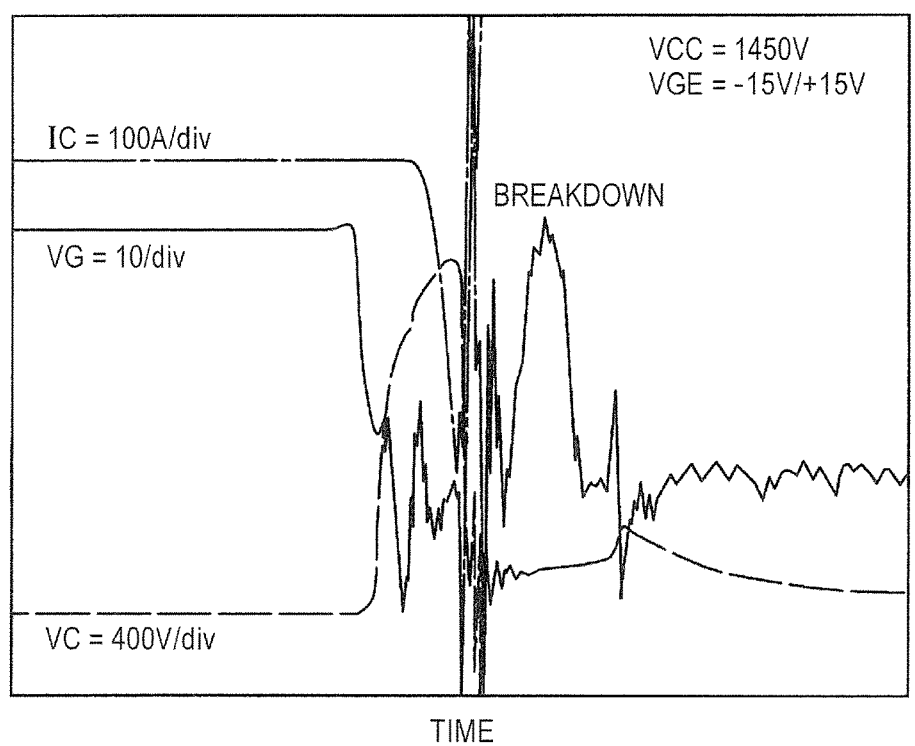
FIG. 26 is a waveform chart showing a breakdown mode in the semiconductor device at a turn-OFF time.

FIG. 25 is a plan view showing the semiconductor device (cell formation area) according to the comparative example. FIG. 26 is a waveform chart showing a breakdown mode at the turn-OFF time in the semiconductor device.

As shown in FIG. 25, in the cell formation area AR1 in the semiconductor device according to the comparative example, in the same manner as in the cell formation area AR1 in the semiconductor device in Embodiment 1 described above, the plurality of hybrid cell regions LCh as active cell regions and the plurality of inactive cell regions LCi are provided. Also, in the cell formation area AR1, the plurality of $n^+$-type emitter regions NE are arranged in a staggered configuration in plan view. However, in the end-portion area of the cell formation area AR1 in the X-axis direction (direction in which the hybrid cell regions LCh are periodically arranged) which is in contact with the termination area TA provided outside the cell formation area AR1, a dummy cell formation area DA is provided in which the hybrid cell regions LCh where the $n^+$-type emitter regions NE are not formed are arranged.

In the termination area TA, there is no escape way for carriers (holes). Consequently, when the hybrid cell regions LCh where the plurality of $n^+$-type emitter regions NE are formed are arranged even in the end-portion area of the cell formation area AR1 in the X-axis direction, the carriers (holes) stored in the termination area TA are localized to the end-portion area of the cell formation area AR1 in the X-axis direction at the turn-OFF time. As a result, as shown in, e.g., FIG. 26, the semiconductor device may break down at the turn-OFF time. Accordingly, to prevent the breakdown, in the end-portion area of the cell formation area AR1 in the X-axis direction, the dummy cell formation area DA in which the hybrid cell regions LCh where the $n^+$-type emitter regions NE are not formed are arranged is normally provided. By thus forming a region where carriers (holes) do not flow, a configuration in which current constriction is less likely to occur can be provided.

However, in the configuration shown in FIG. 25, the cell formation area AR1 has the dummy cell formation area DA in which the hybrid cell regions LCh where the $n^+$-type emitter regions NE are not formed are arranged. This presents a problem in that the plane area of the cell formation area AR1 is substantially reduced and consequently the cell formation area AR1 cannot effectively be used.

<Configuration of Semiconductor Device in Embodiment 2>

Figure 27:
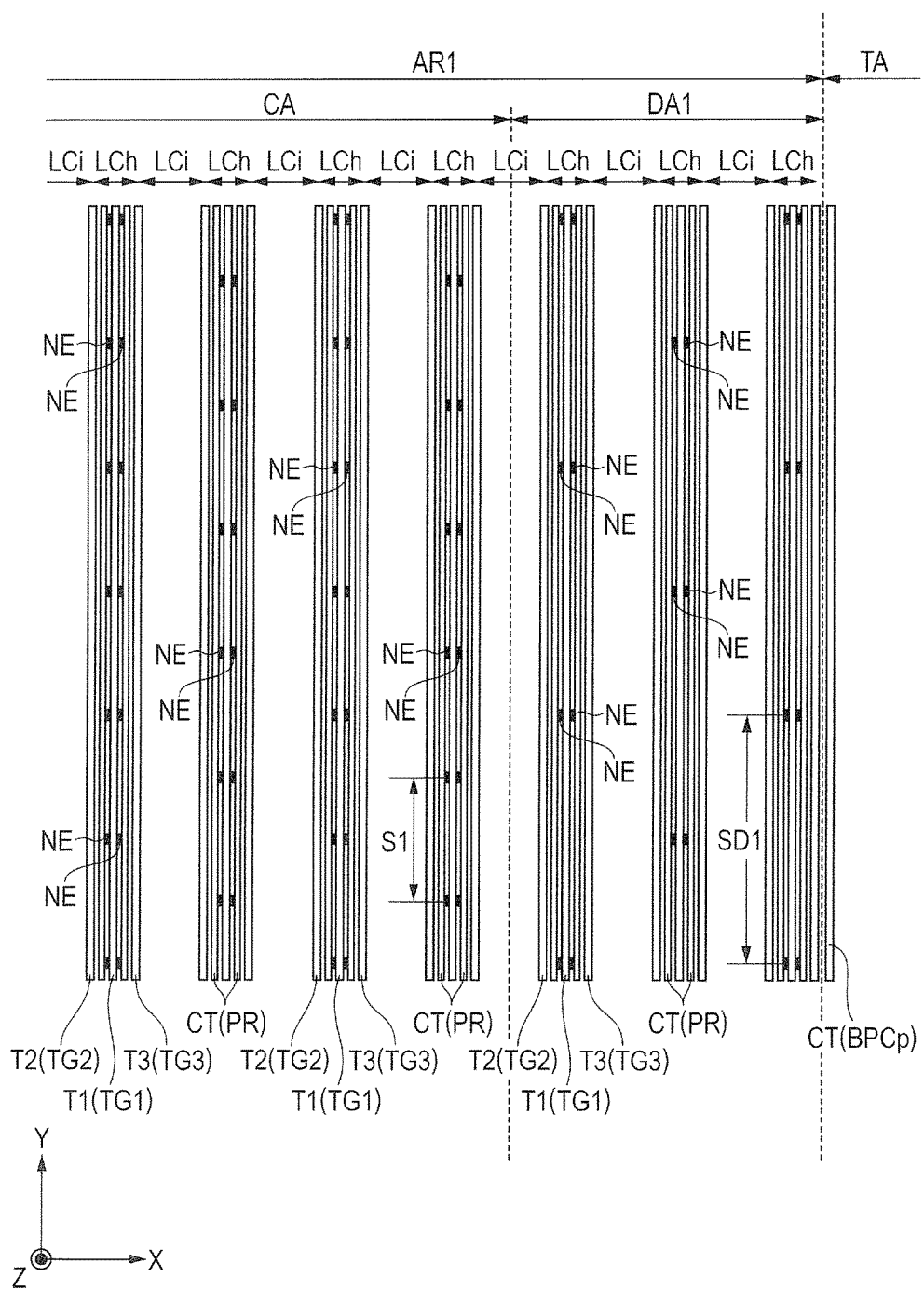
FIG. 27 is a plan view showing a first example of a semiconductor device (cell formation area) according to Embodiment 2.
Figure 28:
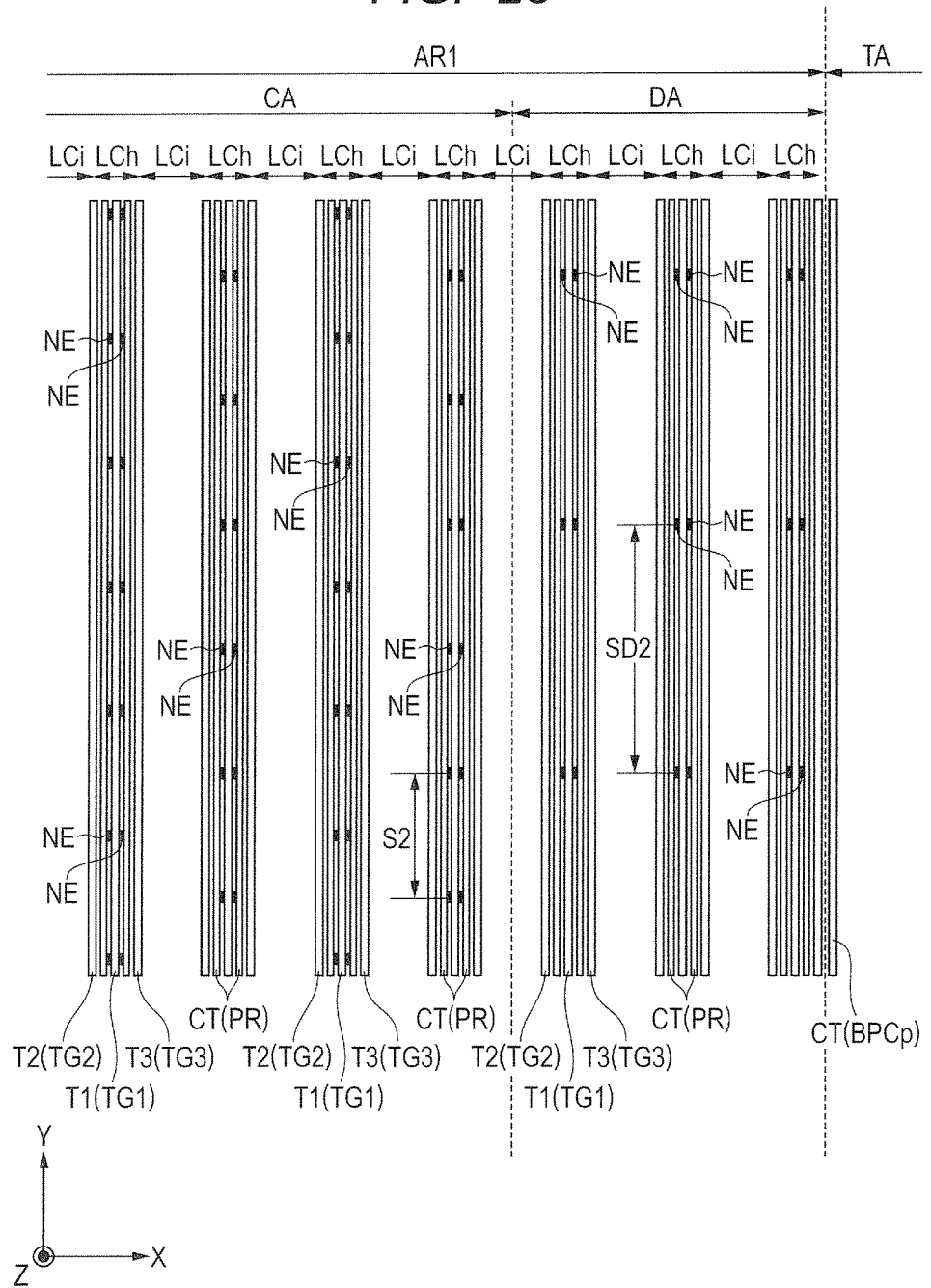
FIG. 28 is a plan view showing a second example of the semiconductor device (cell formation area) according to Embodiment 2.

Using FIGS. 27 and 28, the following will describe a configuration of a cell formation area in a semiconductor device according to Embodiment 2 which allows effective use of the dummy cell formation area DA provided in the end-portion area of the cell formation area AR1 in the X-axis direction.

FIG. 27 is a plan view showing a first example of the semiconductor device (cell formation area) according to Embodiment 2. FIG. 28 is a plan view showing a second example of the semiconductor device (cell formation area) according to Embodiment 2. Note that, in FIGS. 27 and 28, for improved clarity of illustration, $n^+$-type emitter regions are blacked out.

As shown in FIG. 27, in the cell formation area AR1 in the first example of the semiconductor device according to Embodiment 2, in the same manner as in the cell formation area AR1 of the semiconductor device according to Embodiment 1 described above, the plurality of hybrid cell regions LCh as active cell regions and the plurality of inactive cell regions LCi are provided. Also, in an end-portion area DA1 of the cell formation area AR1 in the X-axis direction, which is the same area as the dummy cell formation area DA provided in the semiconductor device according to the comparative example, the plurality of $n^+$-type emitter regions NE are arranged in a staggered configuration in plan view. In addition, in an active area CA of the cell formation area AR1 other than the foregoing end-portion area DA1, the plurality of $n^+$-type emitter regions NE are arranged in a staggered configuration in plan view.

However, the density of the plurality of $n^+$-type emitter regions NE arranged in the end-portion area DA1 is lower than the density of the plurality of $n^+$-type emitter regions NE arranged in the active area CA. For example, in the active area CA, the plurality of $n^+$-type emitter regions NE are arranged in each of the hybrid cell regions LCh extending in the Y-axis direction so as to be spaced apart at regular intervals S1 in the Y-axis direction. In the end-portion area DA1 also, the plurality of $n^+$-type emitter regions NE are arranged in each of the hybrid cell regions LCh extending in the Y-axis direction so as to be spaced apart at regular intervals SD1 in the Y-axis direction. However, each of the intervals SD1 between the plurality of $n^+$-type emitter regions NE formed in the end-portion portion area DA1 in the Y-axis direction is larger than each of the intervals S1 between the plurality of $n^+$-type emitter regions NE formed in the active area CA in the Y-axis direction. For example, the foregoing interval SD1 is double the foregoing interval S1.

In the first example of the semiconductor device shown in FIG. 27, in the end-portion area DA1, the plurality of $n^+$-type emitter regions NE are arranged in a staggered configuration in plan view. This allows the collector-emitter saturation voltage VCE (sat) to be lower in the first example of the semiconductor device than in, e.g., the semiconductor device (see FIG. 25) according to the comparative example having the dummy cell formation area DA where the $n^+$-type emitter regions NE are not formed. Note that, when a region where carriers (holes) flow is formed, the carriers (holes) stored in the termination area TA flow to the end-portion area DA1 at the turn-OFF time during the conduction of the semiconductor device (in the ON state). However, since the density of the plurality of $n^+$-type emitter regions NE arranged in the end-portion area DA is relatively low, the breakdown voltage drops only slightly.

As shown in FIG. 28, in the cell formation area AR1 in the second example of the semiconductor device according to Embodiment 2, in the same manner as in the cell formation area AR1 in the semiconductor device according to Embodiment 1 described above, the plurality of hybrid cell regions LCh as the active cell regions and the plurality of inactive cell regions LCi are provided. Also, in an end-portion area DA2 of the cell formation area AR1 in the X-axis direction, which is the same area as the dummy cell formation area DA provided in the semiconductor device according to the comparative example, the plurality of $n^+$-type emitter regions NE are arranged in plan view. In addition, in the active area CA of the cell formation area AR1 other than the foregoing end-portion area DA2, the plurality of $n^+$-type emitter regions NE are arranged in the staggered configuration in plan view.

However, unlike in the first example described above, the plurality of n+-type emitter regions NE arranged in the end-portion area DA2 are not arranged in a staggered configuration in plan view. The respective plurality of n+-type emitter regions NE formed in the adjacent two hybrid regions LCh are symmetrically arranged relative to the inactive region LCi interposed between the two hybrid cell regions LCh. In other words, in the end-portion area DA2, the n+-type emitter regions NE are arranged at the respective positions (lattice points) where a plurality of first virtual lines extending over the n−-type emitter regions NE along the X-axis direction cross a plurality of second virtual lines extending over the n+-type emitter regions NE along the Y-axis direction (rectangular lattice arrangement).

The density of the plurality of n+-type emitter regions NE arranged in the end-portion area DA2 is lower than the density of the plurality of n+-type emitter regions NE arranged in the active area CA. For example, in the active area CA, the plurality of n+-type emitter regions NE are arranged in each of the hybrid cell regions LCh extending in the Y-axis direction so as to be spaced apart at regular intervals S2 in the Y-axis direction. In the end-portion area DA2 also, the plurality of n+-type emitter regions NE are arranged in each of the hybrid cell regions LCh extending in the Y-axis direction so as to be spaced apart at regular intervals SD2 in the Y-axis direction. However, each of the intervals SD2 between the plurality of n−-type emitter regions NE formed in the end-portion area DA2 in the Y-axis direction is larger than each of the intervals S2 between the plurality of n+-type emitter regions NE formed in the active area CA in the Y-axis direction. For example, the foregoing interval SD2 is double the foregoing interval S2.

In the second example of the semiconductor device shown in FIG. 28, in the end-portion area DA2, the plurality of n+-type emitter regions NE are arranged in the rectangular lattice configuration in plan view. This allows the breakdown voltage of the semiconductor device to be higher in the second example than in the first example described above, though the effect of reducing the collector-emitter saturation voltage VCE (sat) in the semiconductor device is lower in the second example than in the first example described above.

<Main Advantages and Effects of Semiconductor Device in Embodiment 2>

In the first example of the semiconductor device according to Embodiment 2, in the end-portion area DA1 located in the end portion of the cell formation area AR1 in the X-axis direction, the plurality of n+-type emitter regions NE are arranged. This allows the end-portion area DA1 to be effectively used. However, to prevent current constriction from occurring in the end-portion area DA1, the density of the plurality of n+-type emitter regions NE arranged in the end-portion area DA1 needs to be set lower than the density of the n+-type emitter regions NE arranged in the active area CA of the cell formation area AR1. That is, the intervals SD1 between the plurality of n+-type emitter regions NE arranged in the end-portion area DA1 of the cell formation area AR1 in the Y-axis direction need to be set larger than the intervals S1 between the plurality of n+-type emitter regions NE arranged in the active area CA of the cell formation area AR1 in the Y-axis direction.

Likewise, in the second example of the semiconductor device according to Embodiment 2, in the end-portion area DA2 located in the end portion of the cell formation area AR1 in the X-axis direction, the plurality of n+-type emitter regions NE are arranged. This allows the end-portion area DA2 to be effectively used. However, to prevent current constriction from occurring in the end-portion area DA2, the density of the plurality of n+-type emitter regions NE arranged in the end-portion area DA2 needs to be set lower than the density of the n+-type emitter regions NE arranged in the active area CA of the cell formation area AR1. That is, the intervals SD2 between the plurality of n+-type emitter regions NE arranged in the end-portion area DA2 of the cell formation area AR1 in the Y-axis direction need to be set larger than the intervals S2 between the plurality of n+-type emitter regions NE arranged in the active area CA of the cell formation area AR1 in the Y-axis direction.

In terms of reducing the collector-emitter saturation voltage VCE (sat), the staggered arrangement of the plurality of n+-type emitter regions NE shown in the first example (see FIG. 27) is more preferable than the rectangular lattice arrangement of the plurality of n+-type emitter regions NE shown in the second example (see FIG. 28). However, in terms of increasing the breakdown voltage, the rectangular lattice arrangement of the plurality of n+-type emitter regions NE shown in the second example (see FIG. 28) is more preferable than the staggered arrangement of the plurality of n+-type emitter regions NE shown in the first example (see FIG. 27). Accordingly, by selecting the first example shown in FIG. 27 or the second example shown in FIG. 28 in accordance with an intended use, it is possible to use a more appropriate semiconductor device.

Note that, in the first example of the semiconductor device according to Embodiment 2, the number of the hybrid cell regions LCh arranged in the X-axis direction in the end-portion area DA1 of the cell formation area AR1 is 3. However, the number thereof is not limited thereto. For example, in the end-portion area DA1, one, two, or four or more hybrid cell regions LCh can be arranged. In this case also, the intervals between the plurality of n+-type emitter regions NE arranged in the end-portion area DA1 of the cell formation area AR1 in the Y-axis direction need to be set larger than the intervals between the plurality of n+-type emitter regions NE arranged in the active area CA of the cell formation area AR1 in the Y-axis direction.

Likewise, in the second example of the semiconductor device according to Embodiment 2, the number of the hybrid cell regions LCh arranged in the X-axis direction in the end-portion area DA2 of the cell formation area AR1 is 3. However, the number thereof is not limited thereto. For example, in the end-portion area DA2, one, two, or four or more hybrid cell regions LCh can be arranged. In this case also, the intervals between the plurality of n+-type emitter regions NE arranged in the end-portion area DA2 of the cell formation area AR1 in the Y-axis direction need to be set larger than the intervals between the plurality of n+-type emitter regions NE arranged in the active area CA of the cell formation area AR1 in the Y-axis direction.

Embodiment 3

<Configuration of Module in Embodiment 3>

In Embodiment 3, a description will be given of an example in which a semiconductor device according to Embodiment 3 is a module having a plurality of semiconductor chips each including the semiconductor device according to Embodiment 1 described above, and the plurality of semiconductor chips are coupled in parallel to each other.

Figure 29:
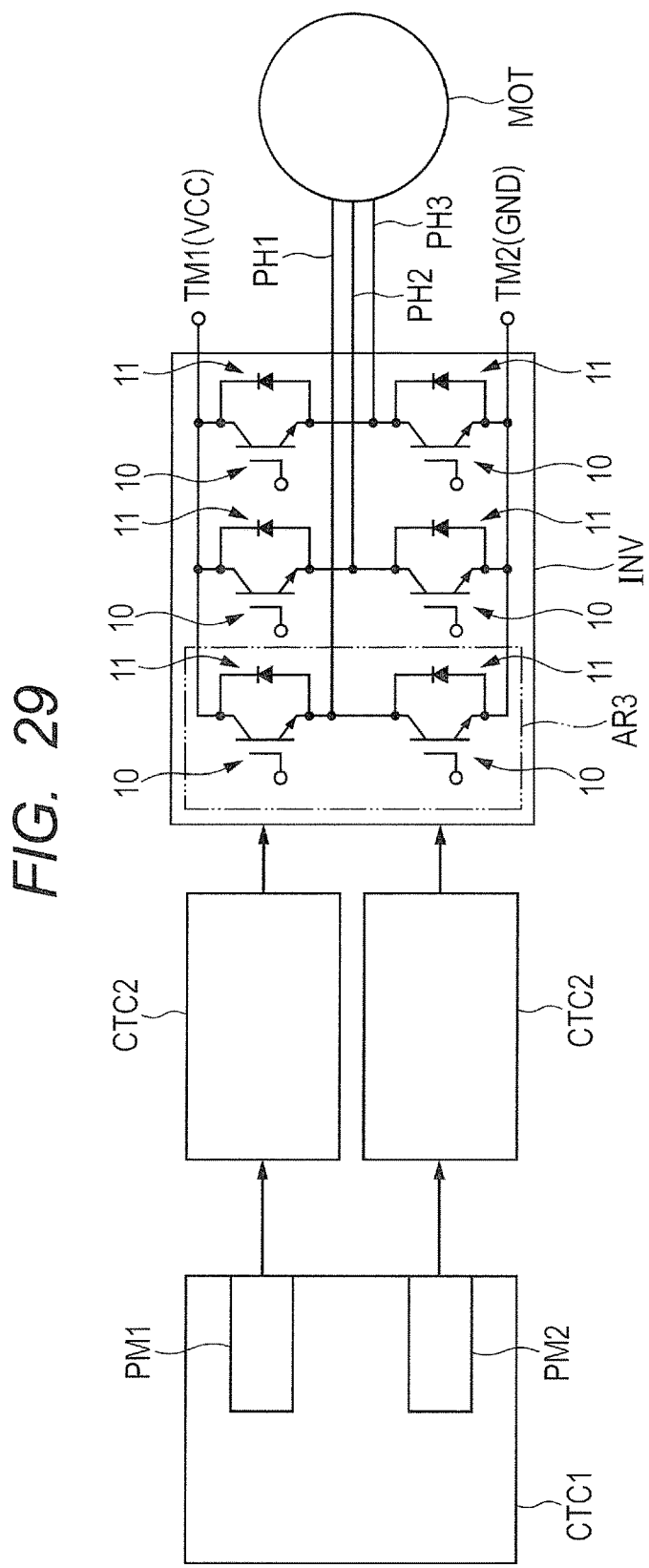
FIG. 29 is a circuit block diagram showing an electronic system according to Embodiment 3.
Figure 30:
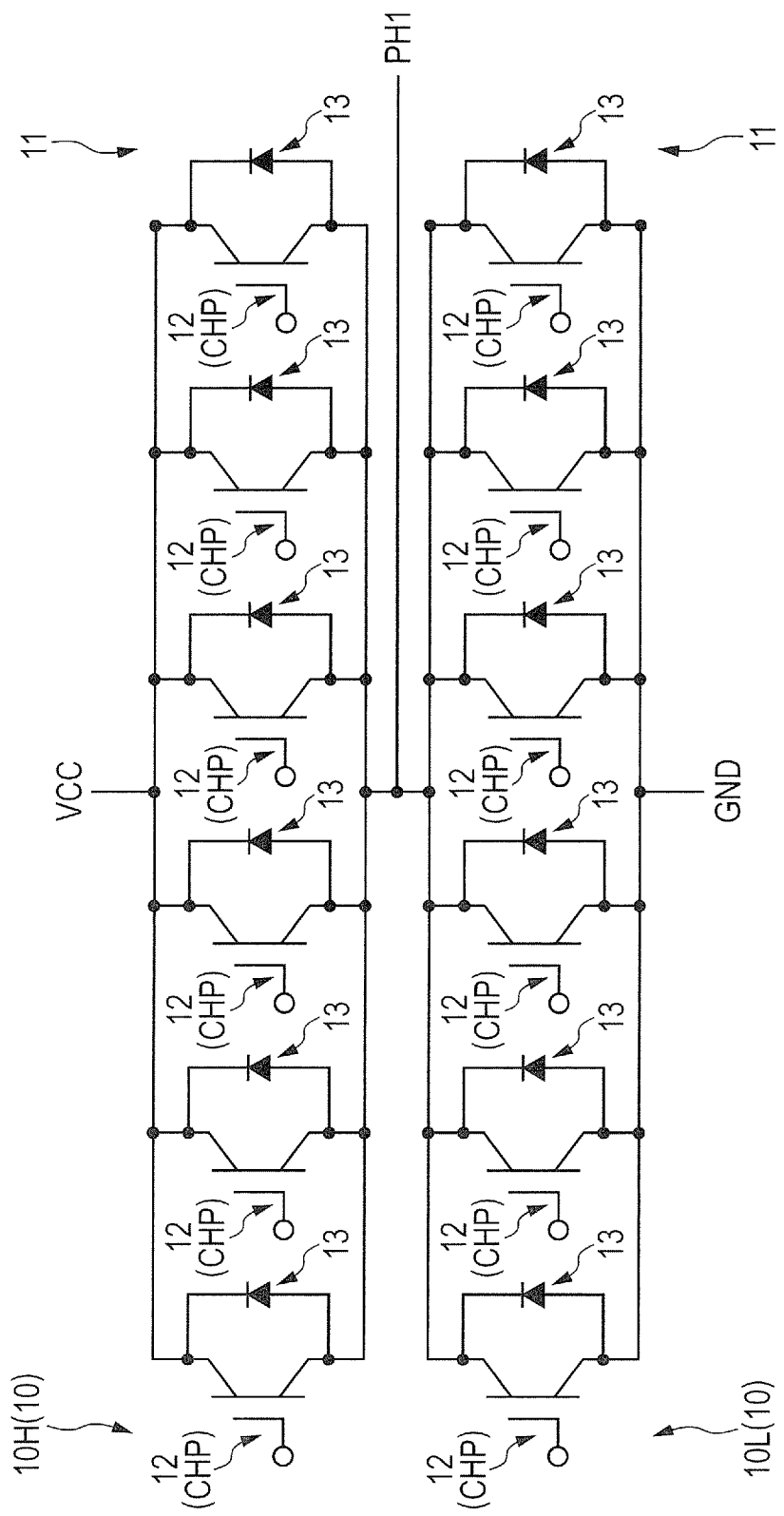
FIG. 30 is an equivalent circuit diagram showing a module according to Embodiment 3.

FIG. 29 is a circuit block diagram showing an example of an electronic system using the semiconductor device according to Embodiment 3. FIG. 30 is an equivalent circuit diagram showing the module as the semiconductor device according to Embodiment 3. FIG. 30 shows two of six IGBT modules 10 included in an inverter INV shown in FIG. 29 which correspond to a U-phase PH1.

As shown in FIG. 29, the electronic system using the semiconductor device according to Embodiment 3 has a load such as a motor MOT, the inverter INV, a control circuit CTC1, and a control circuit CTC2. Examples of such an electronic system include a solar power generation system, a wind force power generation system, and an uninterruptible power supply (UPS) system. As the motor MOT, a 3-phase motor is used herein. The 3-phase motor is configured so as to be driven with a 3-phase voltage in different phases. The control circuit CTC1 includes a plurality of power modules PM1 and PM2.

In the electronic system shown in FIG. 29, an output of a power generation module (the illustration thereof is omitted) in, e.g., a solar power generation system, a wind force power generation system, or an uninterruptible power supply system is coupled to input terminals TM1 and TM2 of the inverter INV. A dc voltage from the power generation module, i.e., a dc power is supplied to the inverter INV.

The control circuit CTC1 is formed of, e.g., an ECU (Electronic Control Unit) and has an embedded control semiconductor chip such as a MCU (Micro Controller Unit). The control circuit CTC1 includes the plurality of power modules PM1 and PM2. Each of the power modules PM1 and PM2 is also formed of, e.g., an ECU and has an embedded control semiconductor chip such as a MCU.

The plurality of power modules PM1 and PM2 included in the control circuit CTC1 are coupled to the control circuit CTC2. The inverter INV is controlled by the control circuit CTC2. The control circuit CTC2 includes, e.g., a gate driver and a photocoupler, though the illustration thereof is omitted. The gate driver (the illustration thereof is omitted) included in the control circuit CTC2 is coupled to the inverter INV. At this time, the gate driver (the illustration thereof is omitted) included in the control circuit CTC2 is coupled to the gate electrode of the IGBT included in the inverter INV.

The inverter INV is coupled to the motor MOT. The dc voltage, i.e., dc power supplied from the power generation module (the illustration thereof is omitted) in, e.g., the solar power generation system, the wind force power generation system, or the uninterruptible power supply system is converted to an ac voltage, i.e., ac power in the inverter INV and supplied to the motor MOT. The motor MOT is driven with the ac voltage, i.e., ac power supplied from the inverter INV.

In the example shown in FIG. 29, the motor MOT is a 3-phase motor including the U-phase PH1, a V-phase PH2, and a W-phase PH3. Accordingly, the inverter INV also corresponds to the three phases which are the U-phase PH1, the V-phase PH2, and the W-phase PH3. The inverter INV corresponding to such three phases has the total of six pairs of the IGBT modules 10 and diode modules 11.

The semiconductor device according to Embodiment 3 is equivalent to the IGBT module 10. Also, as shown in FIG. 30, the IGBT module 10 includes a plurality of IGBT chips 12, and each of the IGBT chips 12 corresponds to the semiconductor chip CHP (see FIG. 1).

Note that, when the motor MOT is a 2-phase motor, the inverter INV has the total of four pairs of the IGBT modules 10 and the diode modules 11.

Of the inverter INV, the part having a potential closer to a power supply potential VCC relative to the input potential to the motor MOT is referred to as a HIGH-side part. Also, of the inverter INV, the part having a potential closer to a ground potential GND relative to the input potential to the motor MOT is referred to as a LOW-side part. In the example shown in FIG. 29, as the HIGH-side IGBT modules 10, the three IGBT modules 10 are used and, as the LOW-side IGBT modules, the three IGBT modules 10 are used. Also, as the HIGH-side diode modules 11, the three diode modules 11 are used and, as the LOW-side diode modules 11, the three diode modules 11 are used.

Of the two IGBT modules 10 corresponding to, e.g., the U-phase shown in an area AR3 in FIG. 29, a HIGH-side IGBT module 10H includes the plurality of, e.g., six IGBT chips 12 each made of the semiconductor chip CHP. Also, of the two IGBT modules 10 corresponding to, e.g., the U-phase, a LOW-side IGBT module 10L includes the plurality of, e.g., six IGBT chips 12 each made of the semiconductor chip CHP. In either the HIGH-side part or the LOW-side part, the respective emitter electrodes EE of the plurality of IGBT chips 12 are electrically coupled to each other, and the respective collector electrodes CE of the plurality of IGBT chips 12 are electrically coupled to each other.

As each of the plurality of IGBT chips 12 included in each of the IGBT modules 10, the semiconductor device according to Embodiment 1 described above and shown in FIGS. 1 to 4 can be used.

In the example shown in FIG. 29, in each of the three phases which are the U-phase PH1, the V-phase PH2, and the W-phase PH3, the IGBT module 10 and the diode module 11 are coupled in anti-parallel to each other between the power supply potential VCC supplied to the inverter INV via the input terminals TM1 and TM2 and the input potential to the motor MOT, i.e., in the HIGH-side part. Also, in each of the three phases which are the U-phase PH1, the V-phase PH2, and the W-phase PH3, the IGBT module 10 and the diode module 11 are coupled in anti-parallel to each other between the input potential to the motor MOT and the ground potential GND, i.e., in the LOW-side part.

To the gate electrode of each of the plurality of IGBT chips 12 included in each of the six IGBT modules 10, the control circuit CTC2 is coupled to control each of the plurality of IGBT chips 12 included in the six IGBT modules 10. Note that each of the six diode modules 11 includes the plurality of diodes 13, and each of the IGBT chips 12 and each of the diodes 13 are coupled in anti-parallel to each other.

The current flowing in each of the IGBT modules 10 is controlled using the control circuit CTC2 to drive and rotate the motor MOT. That is, by controlling the turning ON/OFF of each of the IGBT modules 10 using the control circuit CTC2, the motor MOT can be driven. When the motor MOT is thus driven, it is necessary to turn ON/OFF the IGBT module 10. However, the motor MOT includes inductance. Accordingly, when the IGBT module 10 is turned OFF, the inductance included in the motor MOT causes a reverse current in a direction opposite to the direction in which the current flows in the IGBT module 10. Since the IGBT module 10 does not have the function of allowing the reverse current to flow, by providing the diode module 11 in anti-parallel to the IGBT module 10, the reverse current is caused to flow backward and release the energy stored in the inductance.

<Main Advantages and Effects of Module in Embodiment 3>

As described above, as each of the plurality of IGBT chips included in each of the IGBT modules 10 as the module according to Embodiment 3, the semiconductor device according to Embodiment 1 described above can be used.

Accordingly, in each of the plurality of IGBT chips 12 included in the IGBT module 10 also, in the same manner as in the semiconductor device according to Embodiment 1 descried above, it is possible to improve the IE effect, reduce the switching loss at the turn-ON time, and reduce the collector-emitter saturation voltage VCE (sat).

For example, in a module in an electronic system such as a solar power generation system, a wind force power generation system, or an uninterruptible power supply system, it is necessary to control high power. In such a module involving the use of high power, as the power increases, the number of the IGBT chips 12 coupled in parallel to each other increases. However, in a module in which a large number of IGBT chips 12 are coupled in parallel to each other, a current is typically localized to any of the IGBT chips 12 under the influence of an imbalance occurring upon the switching thereof. Consequently, a problem such as breakdown or an increased loss is likely to arise.

However, in the semiconductor device according to Embodiment 1 described above, the transient IE effect is promoted to increase the speed at which the ON voltage falls at the turn-ON time, as described above. Accordingly, by using the semiconductor device according to Embodiment 1 described above for each of the plurality of IGBT chips 12 included in the IGBT module 10 as the module in Embodiment 3, an imbalance is less likely to occur in the IGBT module 10 upon the switching thereof. As a result, it is possible to provide the IGBT module 10 having improved stability and a reduced loss.

Note that, as each of the plurality of IGBT chips 12 included in the IGBT module 10 as the module in Embodiment 3, each of the semiconductor device in the modification of Embodiment 1 described above and the semiconductor device in Embodiment 2 described above can be used. At this time, each of the plurality of IGBT chips 12 included in the module in Embodiment 3 has not only the same effects as those of the semiconductor device according to Embodiment 1 described above, but also the respective effects of the semiconductor device in the modification of Embodiment 1 described above and the semiconductor device in Embodiment 2 described above.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
   a semiconductor substrate having a first main surface and a second main surface opposite to the first main surface;
   a first semiconductor layer having a first conductivity type and formed in the semiconductor substrate;
   a second semiconductor layer having a second conductivity type different from the first conductivity type and formed in the semiconductor substrate located between the first semiconductor layer and the second main surface;
   a plurality of element portions provided in the first main surface of the semiconductor substrate to be spaced apart from each other in a first direction in plan view and extend in a second direction orthogonal to the first direction; and
   a plurality of interposed portions provided in the first main surface of the semiconductor substrate to be interposed between the element portions in plan view,
   wherein each of the element portions has:
   a first trench provided in one of boundary portions between the element portion and the interposed portions to extend from the first main surface in the second direction in plan view and reach a middle point in the first semiconductor layer;
   a second trench provided in the other of the boundary portions between the element portion and the interposed portions to extend from the first main surface in the second direction in plan view and reach a middle point in the first semiconductor layer;
   a third trench provided between the first and second trenches to extend from the first main surface in the second direction in plan view and reach a middle point in the first semiconductor layer;
   a first trench electrode embedded in the first trench via a first insulating film;
   a second trench electrode embedded in the second trench via a second insulating film;
   a third trench electrode embedded in the third trench via a third insulating film;
   a first semiconductor region having the second conductivity type and formed in the first main surface of the semiconductor substrate located between the first and third trenches to come in contact with the first and third insulating films;
   a second semiconductor region having the second conductivity type and formed in the first main surface of the semiconductor substrate located between the second and third trenches to come in contact with the second and third insulating films;
   a first coupling portion provided between the first and third trenches to extend in the second direction in plan view and reach a middle point in the first semiconductor region;
   a second coupling portion provided between the second and third trenches to extend in the second direction in plan view and reach a middle point in the second semiconductor region; and
   a plurality of third semiconductor regions each having the first conductivity type and formed in the first main surface of the semiconductor substrate located between the first coupling portion and the third trench and between the second coupling portion and the third trench in contact relation with the third insulating film to be shallower than the first and second coupling portions and spaced apart at a regular interval in the second direction in plan view,
   wherein each of the interposed portions has a fourth semiconductor region having the second conductivity type and reaching the first semiconductor layer from the first main surface, and
   wherein, with regard to two of the element portions which are adjacent to each other in the first direction with the interposed portion being interposed therebetween, one of the third semiconductor regions formed in one of the adjacent two element portions is disposed in the first direction from a region interposed between two of the third semiconductor regions formed in the other of the adjacent two element portions which are adjacent to each other in the second direction.

2. The semiconductor device according to claim 1, wherein, with regard to two of the element portions which are adjacent to each other in the first direction, one of the third semiconductor regions formed in one of the adjacent two element portions is disposed in the first direction from a position corresponding to half an interval between two of the third semiconductor regions formed in the other of the adjacent two element portions which are adjacent to each other in the second direction.

3. The semiconductor device according to claim 1, wherein the third semiconductor regions are arranged in a staggered configuration in plan view.

4. The semiconductor device according to claim 1, wherein a basic pattern in which the third semiconductor regions are located at individual vertices of a triangle is consecutively arranged in plan view.

5. The semiconductor device according to claim 1, wherein the respective third semiconductor regions formed in two of the element portions which are adjacent to each other in the first direction are asymmetrically arranged relative to the interposed portion located between the two element portions adjacent to each other in the first direction.

6. The semiconductor device according to claim 1, wherein a depth of the fourth semiconductor region from the first main surface is deeper than respective depths of the first and second trenches from the first main surface.

7. The semiconductor device according to claim 1, wherein each of the first and second coupling portions is formed continuously in the second direction.

8. A semiconductor device, comprising:
a semiconductor substrate having a first main surface and a second main surface opposite to the first main surface;
a first semiconductor layer having a first conductivity type and formed in the semiconductor substrate;
a second semiconductor layer having a second conductivity type different from the first conductivity type and formed in the semiconductor substrate located between the first semiconductor layer and the second main surface;
a cell formation area provided in a center portion of the semiconductor substrate in plan view;
a termination area provided outside the cell formation area in plan view;
a plurality of element portions provided in the first main surface of the semiconductor substrate located in the cell formation area to be spaced apart from each other in a first direction in plan view and extend in a second direction orthogonal to the first direction; and
a plurality of interposed portions provided in the first main surface of the semiconductor substrate located in the cell formation area to be interposed between the element portions in plan view,
wherein each of the element portions has:
a first trench provided in one of boundary portions between the element portion and the interposed portions to extend from the first main surface in the second direction in plan view and reach a middle point in the first semiconductor layer;
a second trench provided in the other of the boundary portions between the element portion and the interposed portions to extend from the first main surface in the second direction in plan view and reach a middle point in the first semiconductor layer;
a third trench provided between the first and second trenches to extend from the first main surface in the second direction in plan view and reach a middle point in the first semiconductor layer;
a first trench electrode embedded in the first trench via a first insulating film;
a second trench electrode embedded in the second trench via a second insulating film;
a third trench electrode embedded in the third trench via a third insulating film;
a first semiconductor region having the second conductivity type and formed in the first main surface of the semiconductor substrate located between the first and third trenches to come in contact with the first and third insulating films;
a second semiconductor region having the second conductivity type and formed in the first main surface of the semiconductor substrate located between the second and third trenches to come in contact with the second and third insulating films;
a first coupling portion provided between the first and third trenches to extend in the second direction in plan view and reach a middle point in the first semiconductor region;
a second coupling portion provided between the second and third trenches to extend in the second direction in plan view and reach a middle point in the second semiconductor region; and
a plurality of third semiconductor regions each having the first conductivity type and formed in the first main surface of the semiconductor substrate located between the first coupling portion and the third trench and between the second coupling portion and the third trench in contact relation with the third insulating film to be shallower than the first and second coupling portions and spaced apart at a regular interval in the second direction in plan view,
wherein each of the interposed portions has a fourth semiconductor region having the second conductivity type and reaching the first semiconductor layer from the first main surface,
wherein the cell formation area includes:
a first area located in a center portion of the cell formation area in plan view; and
a second area located between the first area and the termination area in plan view,
wherein the third semiconductor regions formed in each of the element portions located in the first area are spaced apart at a first interval in the second direction, while the third semiconductor regions formed in each of the element portions located in the second area are spaced apart at a second interval in the second direction, the second interval being larger than the first interval, and
wherein, in the first area, with regard to two of the element portions which are adjacent to each other in the first direction with the interposed portion being interposed therebetween, one of the third semiconductor regions formed in one of the adjacent two element portions is disposed in the first direction from a region interposed between two of the third semiconductor regions formed in the other of the adjacent two element portions which are adjacent to each other in the second direction.

9. The semiconductor device according to claim 8, wherein, in the second area, with regard to two of the element portions which are adjacent to each other in the first direction with the interposed portion being interposed therebetween, one of the third semiconductor regions formed in one of the adjacent two element portions is disposed in the first direction from a region interposed between two of the third semiconductor regions formed in the other of the adjacent two element portions which are adjacent to each other in the second direction.

10. The semiconductor device according to claim 9, wherein, in the first area, with regard to two of the element portions which are adjacent to each other in the first direction, one of the third semiconductor regions formed in one of the adjacent two element portions is disposed in the first direction from a position corresponding to half the first interval between two of the third semiconductor regions formed in the other of the adjacent two element portions which are adjacent to each other in the second direction, and wherein, in the second area, with regard to two of the element portions which are adjacent to each other in the first direction, one of the third semiconductor regions formed in one of the adjacent two element portions is disposed in the first direction from a position corresponding to half the second interval between two of the third semiconductor regions formed in the other of the adjacent two element portions which are adjacent to each other in the second direction.

11. The semiconductor device according to claim 9, wherein, in each of the first and second areas, the third semiconductor regions are arranged in a staggered configuration in plan view.

12. The semiconductor device according to claim 9, wherein, in each of the first and second areas, a basic pattern in which the third semiconductor regions are located at individual vertices of a triangle is consecutively arranged in plan view.

13. The semiconductor device according to claim 9, wherein, in each of the first and second areas, the respective third semiconductor regions formed in two of the element portions which are adjacent to each other in the first direction are asymmetrically arranged relative to the interposed portion located between the two element portions adjacent to each other in the first direction.

14. The semiconductor device according to claim 8, wherein, in the second area, the respective third semiconductor regions formed in two of the element portions which are adjacent to each other in the first direction are symmetrically arranged relative to the interposed portion located between the two element portions adjacent to each other in the first direction.

15. The semiconductor device according to claim 14, wherein, in the first area, with regard to two of the element portions which are adjacent to each other in the first direction, one of the third semiconductor regions formed in one of the adjacent two element portions is disposed in the first direction from a position corresponding to half the first interval between two of the third semiconductor regions formed in the other of the adjacent two element portions which are adjacent to each other in the second direction.

16. The semiconductor device according to claim 14, wherein, in the first area, the third semiconductor regions are arranged in a staggered configuration in plan view.

17. The semiconductor device according to claim 14, wherein, in the first area, a basic pattern in which the third semiconductor regions are located at individual vertices of a triangle is consecutively arranged in plan view.

18. The semiconductor device according to claim 14, wherein, in the first area, the respective third semiconductor regions formed in two of the element portions which are adjacent to each other in the first direction are asymmetrically arranged relative to the interposed portion located between the two element portions adjacent to each other in the first direction.

* * * * *